(12) United States Patent
Koizumi

(10) Patent No.: US 11,194,488 B2
(45) Date of Patent: Dec. 7, 2021

(54) MEMORY SYSTEM EXECUTING CALIBRATION ON CHANNELS

(71) Applicant: KIOXIA CORPORATION, Tokyo (JP)

(72) Inventor: Shinya Koizumi, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/799,312

(22) Filed: Feb. 24, 2020

(65) Prior Publication Data

US 2021/0072910 A1 Mar. 11, 2021

(30) Foreign Application Priority Data

Sep. 10, 2019 (JP) .............................. JP2019-164335

(51) Int. Cl.
| | |
|---|---|
| *G06F 13/00* | (2006.01) |
| *G06F 3/06* | (2006.01) |
| *G11C 16/32* | (2006.01) |
| *G11C 16/04* | (2006.01) |

(52) U.S. Cl.
CPC .......... *G06F 3/0632* (2013.01); *G06F 3/0604* (2013.01); *G06F 3/0679* (2013.01); *G11C 16/32* (2013.01); *G11C 16/0483* (2013.01)

(58) Field of Classification Search
CPC ..... G06F 3/0632; G06F 3/0604; G11C 16/32; G11C 3/0679; G11C 16/0483
See application file for complete search history.

(56) References Cited

U.S. PATENT DOCUMENTS

| | | | | |
|---|---|---|---|---|
| 7,269,043 | B2* | 9/2007 | Lee | G11C 5/04 |
| | | | | 365/201 |
| 9,432,298 | B1* | 8/2016 | Smith | H04L 49/9057 |
| 9,583,162 | B1* | 2/2017 | Choi | G11C 7/222 |
| 9,666,245 | B2 | 5/2017 | Arai et al. | |
| 9,965,430 | B2 | 5/2018 | Hu et al. | |
| 10,090,064 | B2* | 10/2018 | Pan | G11C 29/26 |
| 10,193,711 | B2* | 1/2019 | Wieduwilt | G11C 7/1051 |
| 10,284,198 | B2* | 5/2019 | Lee | G11C 7/1057 |
| 10,529,390 | B1* | 1/2020 | Satoh | G06F 3/0673 |
| 10,886,898 | B1* | 1/2021 | Satoh | H03K 19/0005 |
| 2013/0083607 | A1* | 4/2013 | Joo | G11C 16/26 |
| | | | | 365/185.21 |

(Continued)

*Primary Examiner* — Jing-Yih Shyu
(74) *Attorney, Agent, or Firm* — Kim & Stewart LLP

(57) ABSTRACT

A memory system includes: a plurality of nonvolatile memories; a controller connected to the plurality of nonvolatile memories via a plurality of channels that includes a plurality of memory physical layer circuits arranged corresponding to the plurality of channels, respectively, one or more pads for calibration corresponding to the plurality of memory physical layer circuits, and a processor that controls the plurality of memory physical layer circuits. A single reference resistor is connected to the plurality of memory physical layer circuits via the pad. An output based on a ZQ calibration of the plurality of memory physical layer circuits is wired-OR connected to the single reference resistor via the one or more pads. The processor performs a calibration for each of the plurality of memory physical layer circuits in a time division manner using the single reference resistor.

16 Claims, 19 Drawing Sheets

(56) References Cited

U.S. PATENT DOCUMENTS

| | | | |
|---|---|---|---|
| 2014/0266299 A1* | 9/2014 | Seol | H03K 19/0005 |
| | | | 326/30 |
| 2016/0041761 A1* | 2/2016 | Moran | G06F 13/4243 |
| | | | 711/5 |
| 2016/0204782 A1* | 7/2016 | Lee | G11C 7/1096 |
| | | | 365/189.17 |
| 2017/0099050 A1* | 4/2017 | Lee | H03K 19/0005 |
| 2018/0166122 A1 | 6/2018 | Eom et al. | |
| 2019/0043571 A1 | 2/2019 | Damle et al. | |

\* cited by examiner

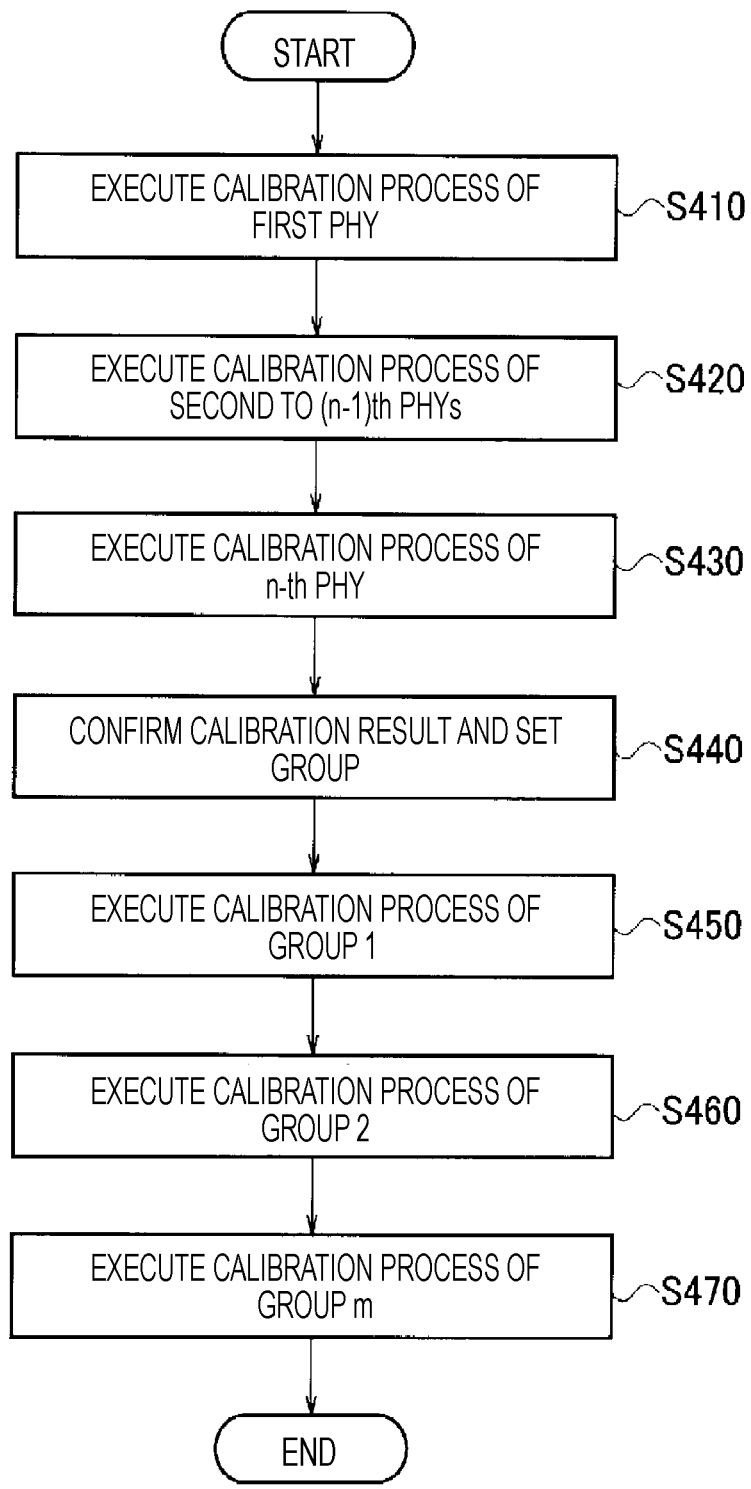

MEMORY SYSTEM EXECUTING CALIBRATION ON CHANNELS

CROSS-REFERENCE TO RELATED APPLICATION

This application is based upon and claims the benefit of priority from Japanese Patent Application No. 2019-164335, filed on Sep. 10, 2019, the entire contents of which are incorporated herein by reference.

FIELD

Embodiments described herein relate generally to a memory system.

BACKGROUND

In a NAND-type flash memory, as the technology progresses, an input/output terminal (I/O) voltage (VDDQ) decreases and a data transfer rate increases. As for the standard of the Joint Electron Device Engineering Council (JEDEC), which is an industry group in the United States that promotes standardization of electronic component standards, an implementation of a zero quotient (ZQ) calibration is recommended in VDDQ=1.2V and a transfer rate of 400 Mbps or higher. The ZQ calibration refers to appropriately calibrating the I/O drive capability resistor Ron and the termination resistor Rtt of On Die Termination (ODT) according to the variation of voltage and temperature conditions (hereinafter, referred to as voltage-temperature (VT) conditions). Here, the ODT refers to a termination resistor provided on a semiconductor chip in order to reduce reflection during signal transmission. In the ZQ calibration, the drive capability resistor Ron and the termination resistor Rtt are calibrated using a high-precision reference resistor connected to the outside of a controller.

DESCRIPTION OF THE DRAWINGS

FIG. 19 is a flowchart illustrating the ZQ calibration process in the memory system according to the fourth embodiment.

DETAILED DESCRIPTION

Figure 1:
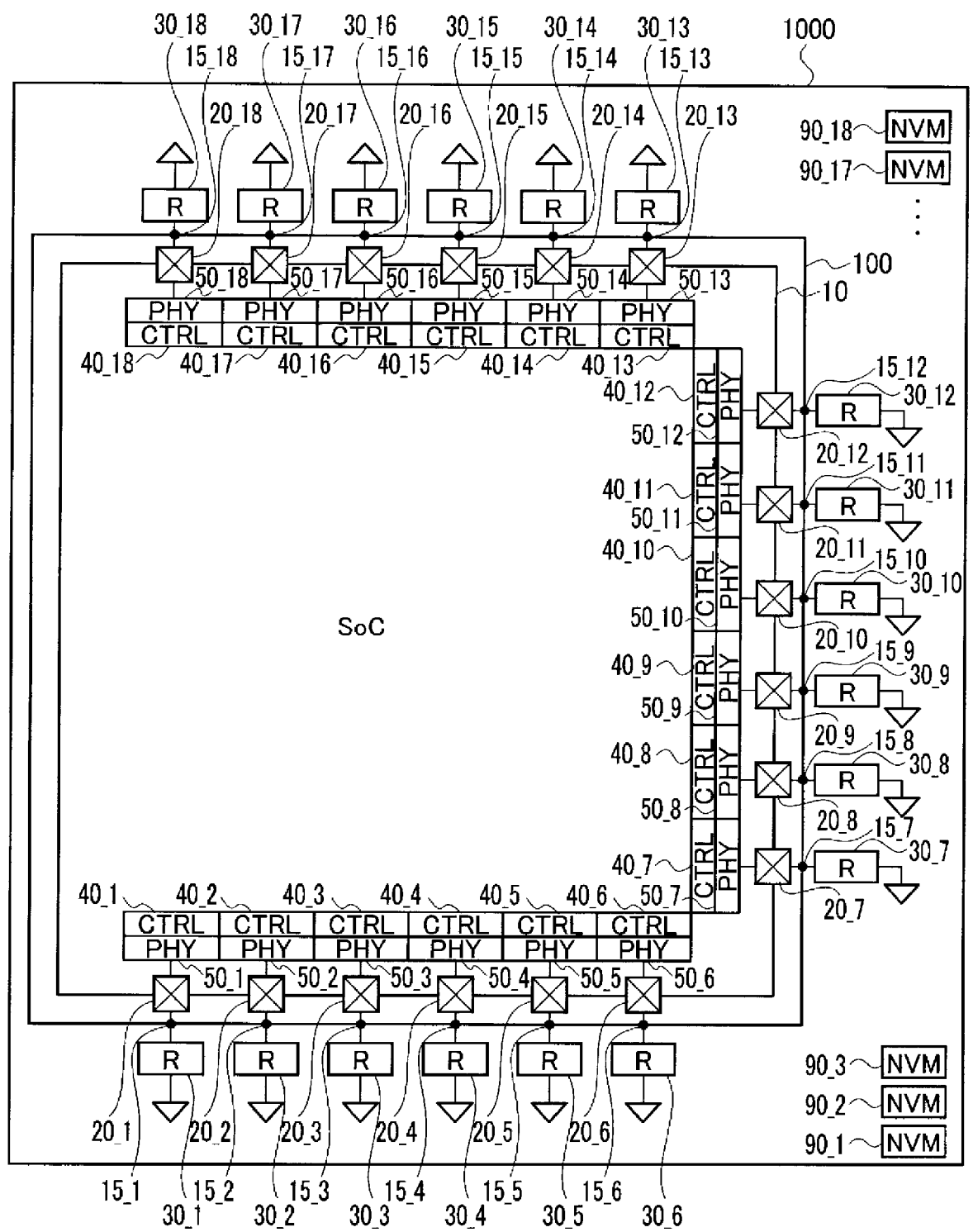
FIG. 1 is a schematic block diagram of a memory system according to a comparative example.

Embodiments provide a memory system in which, even when the number of reference resistors connected to the outside of the controller is reduced in a memory system having a nonvolatile memory connected to a plurality of channels, the ZQ calibration of a memory physical layer circuit of each channel may be performed efficiently and effectively.

In general, according to one embodiment, the memory system includes: a plurality of nonvolatile memories; a controller connected to the plurality of nonvolatile memories via a plurality of channels that includes a plurality of memory physical layer circuits arranged corresponding to the plurality of channels, respectively, one or more pads for calibration corresponding to the plurality of memory physical layer circuits, and a processor that controls the plurality of memory physical layer circuits. A single reference resistor for calibration connected to the plurality of memory physical layer circuits via the one or more pads. An output based on a calibration of each of the plurality of memory physical layer circuits is wired-OR connected and connected to the single reference resistor via the pad. The processor performs a calibration for each of the plurality of memory physical layer circuits in a time division manner using the single reference resistor.

Next, embodiments will be described with reference to the drawings. In the description of the drawings below, the same or similar parts are denoted by the same or similar reference numerals. Furthermore, it needs to be noted that the drawings are schematic, and a relationship between the thickness of each component and the planar dimensions, etc. are not to scale. Therefore, specific thicknesses and dimensions need to be determined in consideration of the following description. In addition, there are parts in which dimensional relationships and ratios differ between the drawings.

Further, the embodiments described below illustrate apparatuses and methods for embodying the technical idea, and do not specify the material, shape, structure, arrangement, and the like of each component. The embodiments may be modified in various ways within the scope of the claims.

Embodiments

In a memory system such as a solid state drive (SSD) having nonvolatile memories connected to a plurality of channels, the input/output characteristics of the I/O of each channel change according to variations in VT conditions. When the characteristics are out of a proper range, highspeed data transfer becomes difficult. Therefore, it is desirable to calibrate the input/output characteristics by the ZQ calibration to have the characteristics be within the proper range.

COMPARATIVE EXAMPLE

FIG. 1 is a schematic block diagram of a memory system according to a comparative example.

The memory system according to the comparative example includes a printed circuit board 1000, a package substrate 100 disposed on the printed circuit board 1000, a System-on-a-Chip (SoC) 10 for an SSD controller disposed on the package substrate 100. The package substrate 100 is, for example, a package substrate on which the SoC 10 is mounted.

A plurality of memory physical layer circuits (PHYs) 50_1, 50_2, 50_3, . . . , 50_18 which are arranged for each channel, and a plurality of memory controllers (CTRL) 40_1, 40_2, 40_3, . . . , 40_18 which control the memory physical layer circuits 50_1, 50_2, 50_3, . . . , 50_18, respectively, are provided in the SoC 10.

Further, reference resistors (R) for ZQ calibration 30_1, 30_2, 30_3, . . . , 30_18 and a nonvolatile memory (NVM) 90 (90_1, 90_2, 90_3, . . . , 90_18) are arranged corresponding to the memory physical layer circuits 50_1, 50_2, 50_3, . . . , 50_18, respectively, on the printed circuit board 1000. In addition, the memory physical layer circuits 50_1, 50_2, 50_3, . . . , 50_18 and the reference resistors 30_1, 30_2, 30_3, . . . , 30_18 are connected to pads for ZQ calibration 20_1, 20_2, 20_3, . . . , 20_18, respectively. Further, the reference resistors 30_1, 30_2, 30_3, . . . , 30_18 and the pads 20_1, 20_2, 20_3, . . . , 20_18 are connected via solder balls 15_1, 15_2, 15_3, . . . , 15_18, respectively.

In the memory system according to the comparative example, in order to perform the ZQ calibration, high-precision reference resistors 30 (30_1, 30_2, 30_3, . . . , 30_18) in accordance with the number of the memory physical layer circuits 50 (50_1, 50_2, 50_3, . . . , 50_18) are needed, and the same number of pads 20 (20_1, 20_2, 20_3, . . . , 20_18) and the same number of solder balls 15 (15_1, 15_2, 15_3, . . . , 15_18) are also required. Therefore, as the number of memory physical layer circuits 50 increases, the number of reference resistors 30, the number of pads 20, and the number of solder balls 15 also increase resulting in increasing the manufacturing cost. An area where the reference resistors 30, the pads 20, the solder balls 15 are arranged, and a wiring area on the package substrate 100 and the printed circuit board 1000 for connecting the components also increase.

First Embodiment

Figure 2:
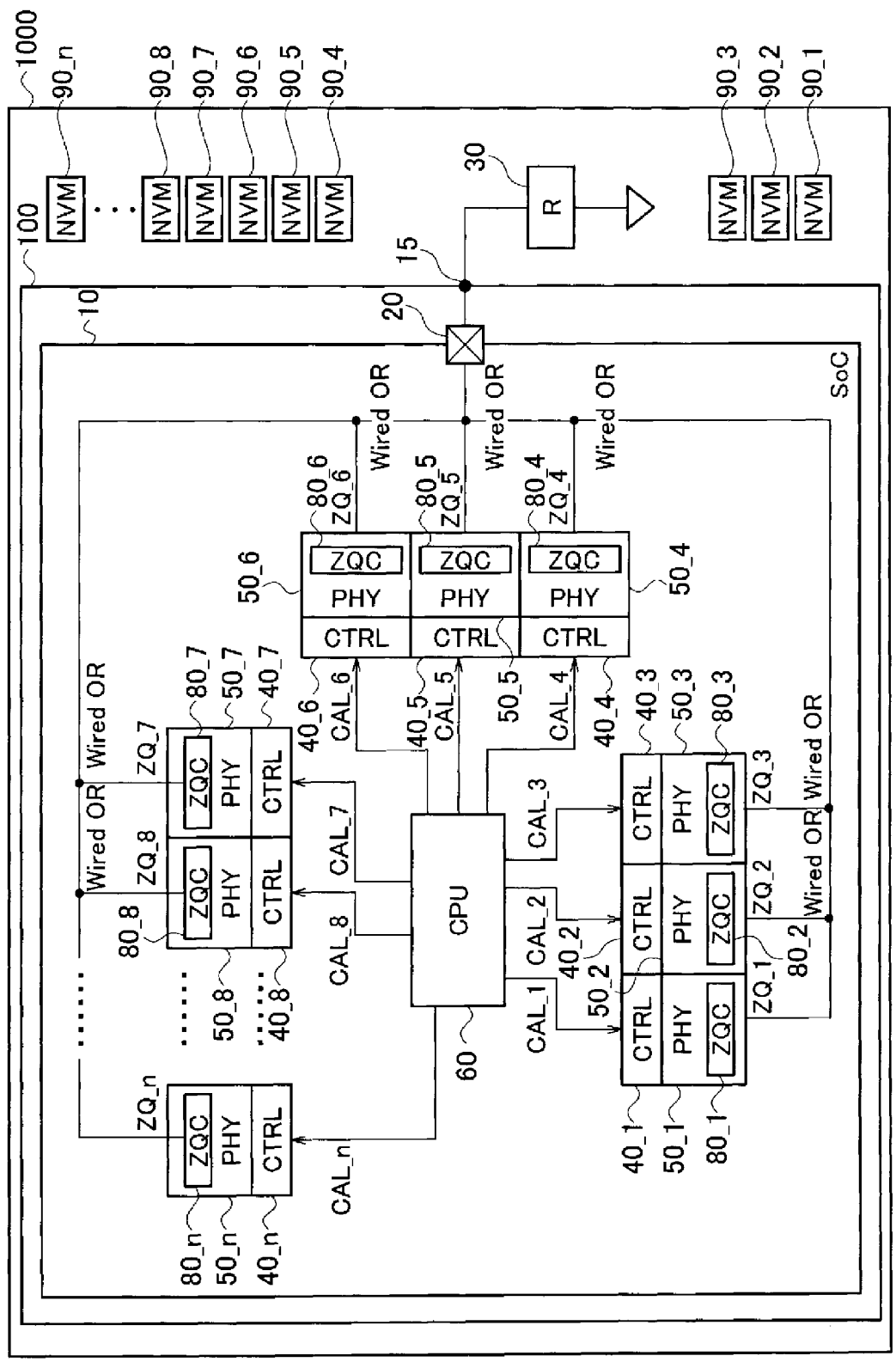
FIG. 2 is a schematic block diagram of a memory system according to the first embodiment.
Figure 3:
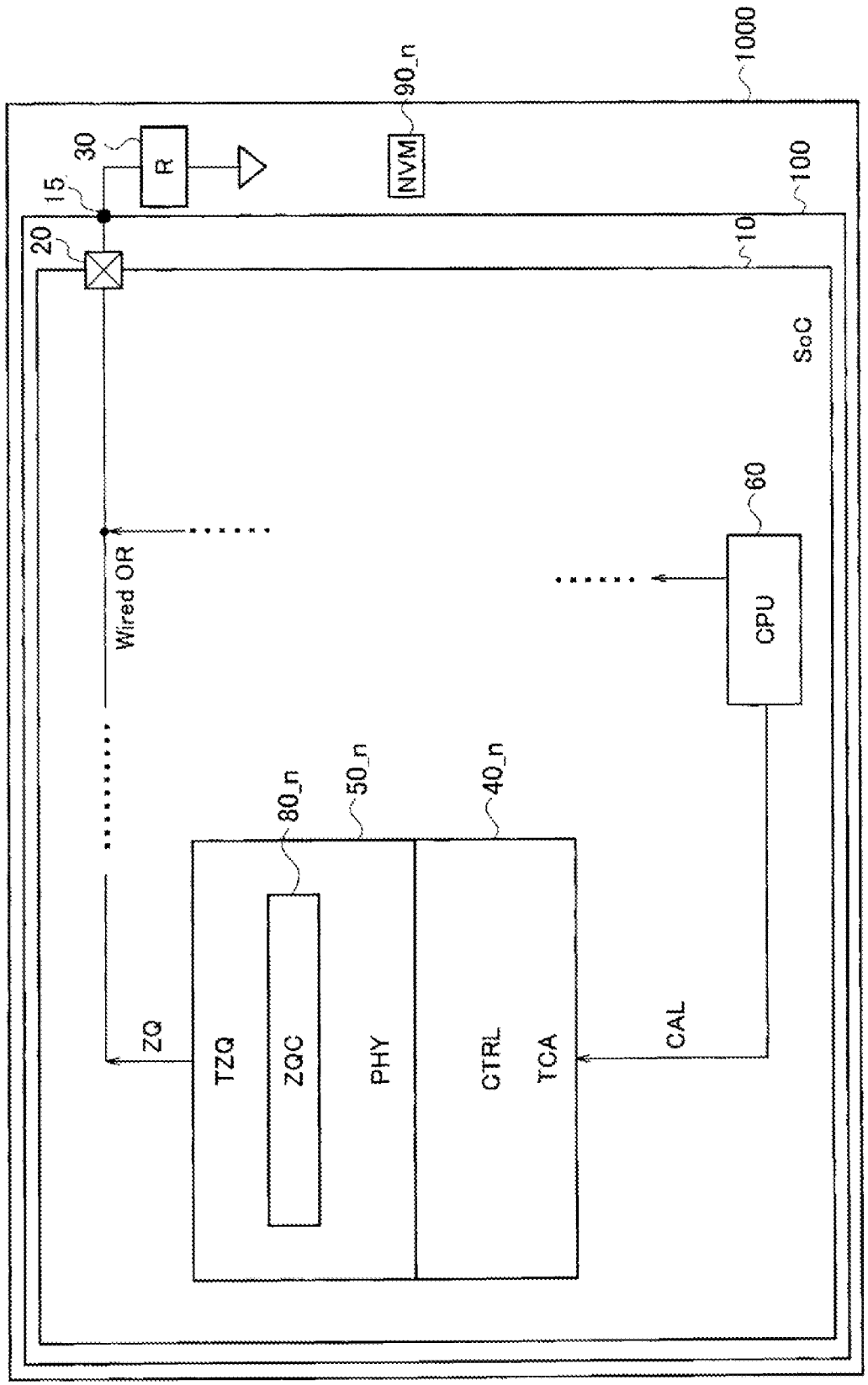
FIG. 3 is a schematic block diagram illustrating a memory controller and a physical layer of an n-th channel in the memory system illustrated in FIG. 2.
Figure 4:
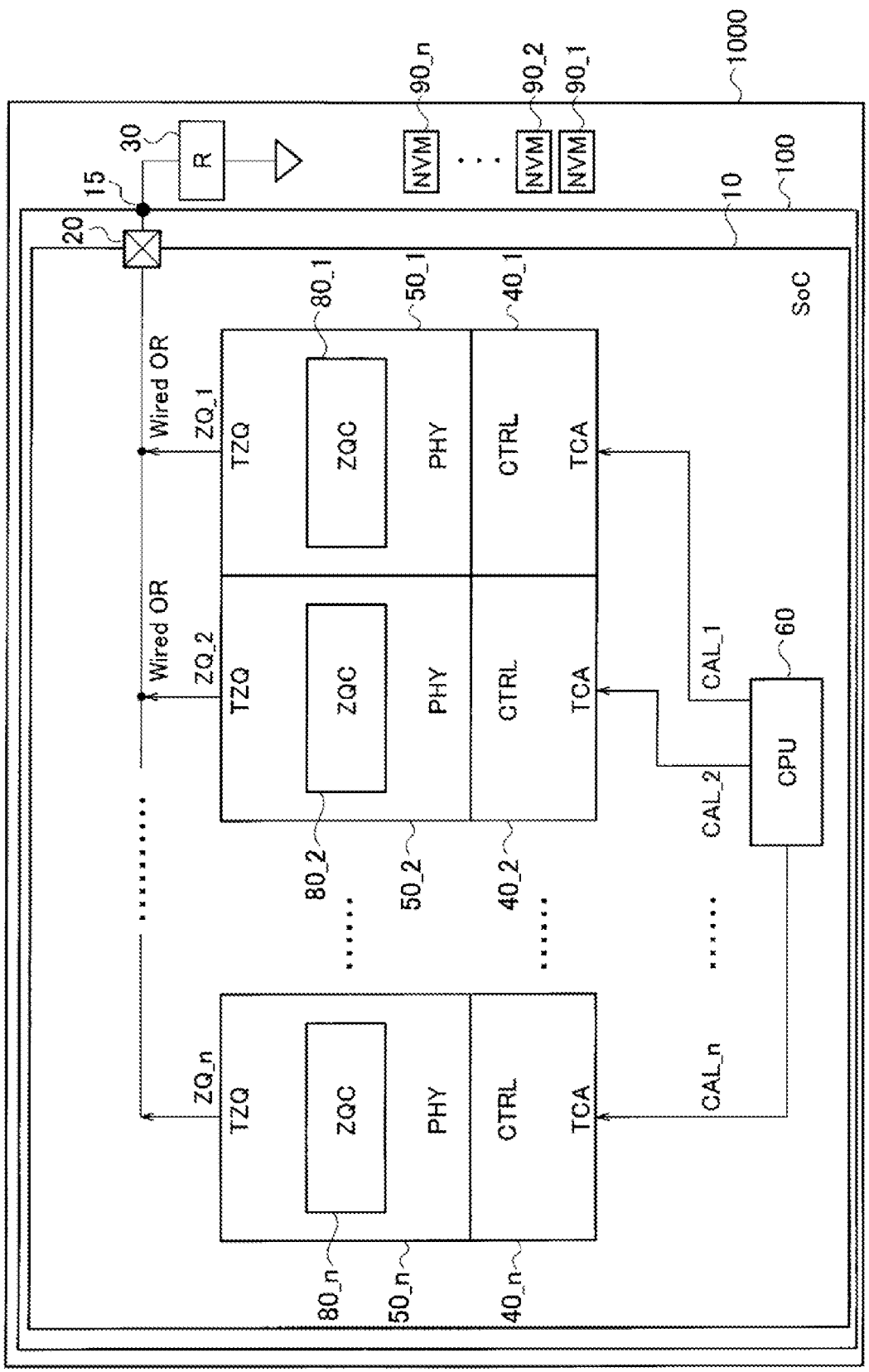
FIG. 4 is a schematic block diagram illustrating each of the memory controller and the physical layer of first to n-th channel in the memory system illustrated in FIG. 2.

A block configuration of a memory system according to a first embodiment is schematically represented as illustrated in FIG. 2. Further, FIG. 3 schematically illustrates a block configuration of a memory controller 40_n and a memory physical layer circuit 50_n of an n-th channel in the memory system illustrated in FIG. 2. FIG. 4 schematically illustrates a block configuration of the memory controllers 40_1, 40_2, 40_3, . . . , 40_n and the memory physical layer circuits 50_1, 50_2, 50_3, . . . , 50_n of a first, second, . . . , n-th channel in the memory system illustrated in FIG. 2.

The memory system according to the first embodiment is configured as, for example, a solid state drive (SSD). The memory system according to the first embodiment includes nonvolatile memories (NVM) 90 (90_1, 90_2, 90_3, . . . , 90_n) and a controller 10. The nonvolatile memories 90 and the controller 10 are connected to each other through a plurality of channels. As for the nonvolatile memory 90, for example, a NAND-type flash memory, a NOR-type flash memory, a resistive random access memory (ReRAM), a phase-change memory (PCM), a ferroelectric random access memory (FeRAM), or the like may be applied. The controller 10 may be configured as a System-on-a-Chip (SoC) or a field-programmable gate array (FPGA). Hereinafter, the controller 10 may be referred to as an SSD controller 10 or an SoC 10.

As illustrated in FIG. 2, the SoC 10 includes: a plurality of memory physical layer circuits (PHYs) 50_1, 50_2, 50_3, . . . , 50_n which are arranged corresponding to a plurality of channels, respectively; a plurality of memory controllers (CTRL) 40_1, 40_2, 40_3, . . . , 40_n which control the plurality of memory physical layer circuits 50_1, 50_2, 50_3, . . . , 50_n, respectively; a single pad for ZQ calibration 20; and a processor 60 (CPU) which controls each part of the SoC 10.

As illustrated in FIGS. 3 and 4, the memory system according to the first embodiment further includes a single reference resistor (R) 30 for ZQ calibration which is connected to each of the memory physical layer circuit 50_1, 50_2, 50_3, . . . , 50_n via the pad 20, on the printed circuit board 1000. A ZQ calibration terminal TZQ of each of the memory physical layer circuits 50_1, 50_2, 50_3, . . . , 50_n is wired-OR connected inside the SoC 10 and connected to the reference resistor 30 via the pad 20 and the solder ball 15. The processor 60 performs a ZQ calibration of each of the memory physical layer circuits 50_1, 50_2, 50_3, . . . , 50_n in a time division manner using the single reference resistor 30.

More specifically, the memory system according to the first embodiment includes the printed circuit board 1000, the package substrate 100 disposed on the printed circuit board 1000, and the SoC 10 disposed on the package substrate 100. Further, the single reference resistor (R) 30 for the ZQ calibration and the nonvolatile memories 90 (90_1, 90_2, 90_3, . . . , 90_n) are disposed on the printed circuit board 1000. The SoC 10 includes the n memory physical layer circuits 50_1, 50_2, 50_3, . . . , 50_n arranged for each channel, the n memory controllers 40_1, 40_2, 40_3, . . . , 40_n that control the memory physical layer circuits 50_1, 50_2, 50_3, . . . , 50_n, respectively, the single pad 20, and the processor 60 that controls each part of the SoC 10.

The ZQ calibration terminal TZQ of each of the memory physical layer circuits 50_1, 50_2, 50_3, . . . , 50_n is wired-OR connected inside the SoC 10 and then connected to the single reference resistor 30 via the single pad 20 and the single solder ball 15. The phrase "wired OR" refers to an OR logic formed by connecting a plurality of signals ZQ_1, ZQ_2, ZQ_3, . . . , ZQ_n output from the ZQ calibration terminal TZQ.

The processor 60 sequentially switches the ZQ calibration execution time of each of the memory physical layer circuits 50_1, 50_2, 50_3, . . . , 50_n in a time division manner using control signals CAL_1, CAL_2, CAL_3, . . . , CAL_n, thereby enabling the ZQ calibration of the plurality of memory physical layer circuits 50_1, 50_2, 50_3, . . . , 50_n using the single reference resistor 30.

More specifically, as illustrated in FIGS. 3 and 4, the processor 60 transmits the control signals CAL_1, CAL_2, CAL_3, . . . , CAL_n to the memory physical layer circuits 50_1, 50_2, 50_3, . . . , 50_n, respectively, to instruct the execution of the ZQ calibration. The control signals CAL_1, CAL_2, CAL_3, . . . , CAL_n are input to the CAL inputs (TCA1, TCA_2, TCA_3, . . . , TCA_n) of the memory controllers 40_1, 40_2, 40_3, . . . , 40_n, respectively. ZQ calibration circuits (ZQC) 80_1, 80_2, 80_3, . . . , 80_n of the memory physical layer circuits 50_1, 50_2, 50_3, . . . , 50_n execute the ZQ calibration of the memory physical layer circuits 50_1, 50_2, 50_3, 50_n, respectively, using the single reference resistor 30 according to the control signals CAL_1, CAL_2, CAL_3, . . . , CAL_n.

The memory physical layer circuits 50_1, 50_2, 50_3, . . . , 50_n incorporate the ZQ calibration circuits 80_1, 80_2, 80_3, . . . , 80_n, respectively. Each of the ZQ calibration circuits 80_1, 80_2, 80_3, . . . , 80_n executes the ZQ calibration using the single reference resistor 30 within the ZQ calibration execution time assigned to each by the processor 60. As a result, an on-resistor Ron and a termination resistor Rtt of each of the memory physical layer circuits 50_1, 50_2, 50_3, . . . , 50_n are calibrated according to the respective VT conditions.

As described above, in the memory system according to the first embodiment, since the number of the pads 20 disposed on the SoC 10, the number of the solder balls 15 disposed on the package substrate 100, and the number of the reference resistors 30 disposed on the printed circuit board 1000, respectively, can be reduced to one, the area of the SoC 10, the package substrate 100, and the printed circuit board 1000 can be reduced, and the cost required for manufacturing the memory system can be reduced.

Further, the ZQ calibration terminal TZQ of each of the memory physical layer circuits 50_1, 50_2, 50_3, . . . , 50_n is wired-OR connected inside the SoC 10 and connected to the reference resistor 30 via the pad 20. Therefore, the wiring area of the package substrate 100 can be reduced as compared with a case where a plurality of wirings for connecting to the reference resistor 30 are provided on the package substrate 100 outside the SoC 10.

Further, since the ZQ calibration execution time of each of the memory physical layer circuits 50_1, 50_2, 50_3, . . . , 50_n is sequentially switched in a time division manner, the memory physical layer circuits 50_1, 50_2, 50_3, . . . , 50_n of each channel can execute the ZQ calibration under their own VT conditions. Therefore, even when the number of reference resistors 30 is reduced, the ZQ calibration of the memory physical layer circuits 50_1, 50_2, 50_3, . . . , 50_n of each channel can be performed efficiently and effectively. That is, in the memory system according to the first embodiment, it is possible to perform the ZQ calibration with high accuracy as compared with a method of diverting a ZQ calibration result of one channel to another channel, or a method of sharing one reference resistor 30 and one pad 20 by a plurality of memory physical layer circuits 50 and performing the ZQ calibration of the memory physical layer circuits 50 of plural channels in parallel during the same time period.

(Modification)

Figure 5:
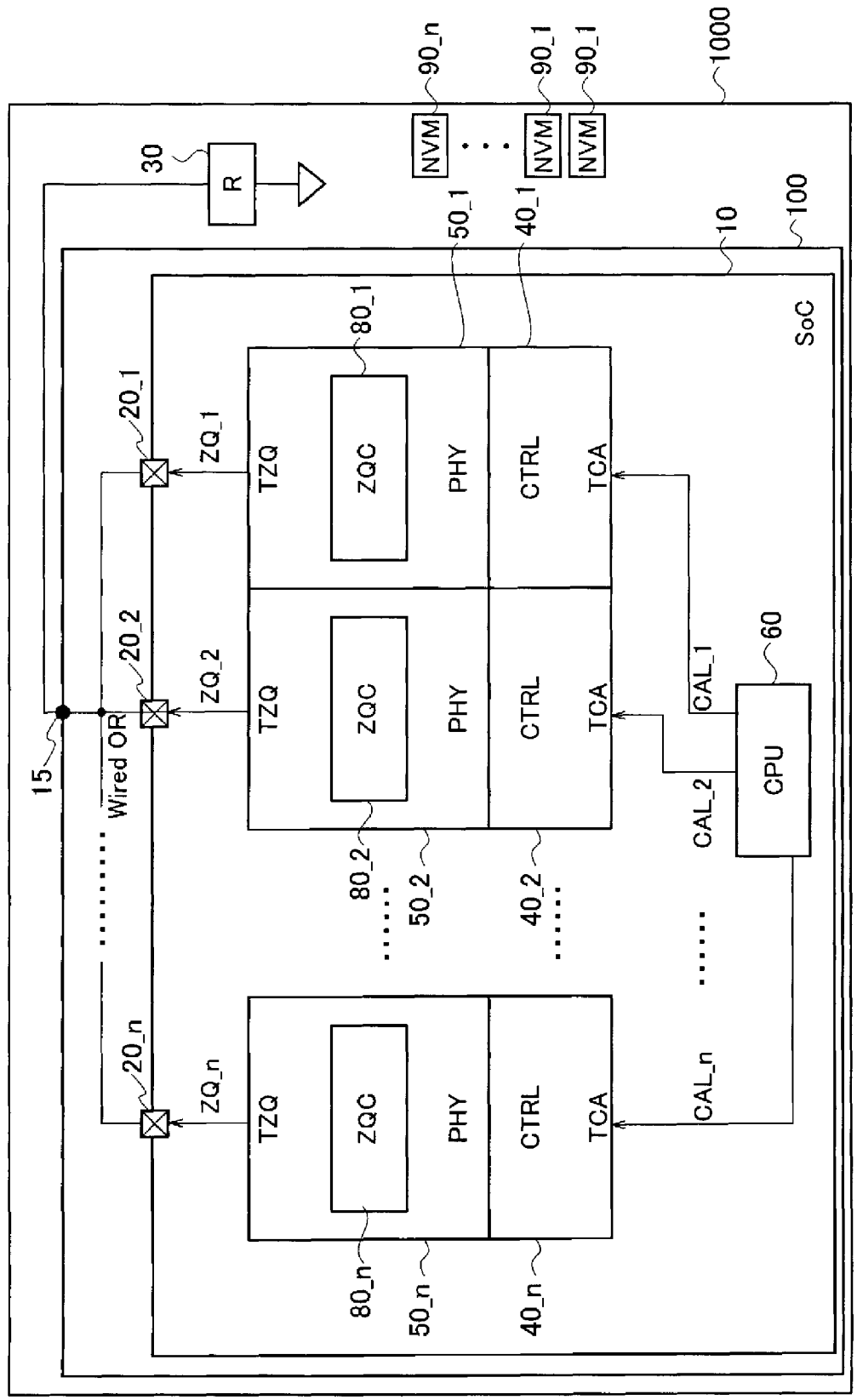
FIG. 5 is a schematic block diagram of a memory system according to a modification of the first embodiment.

A block configuration of a modification of the memory system according to the first embodiment is schematically represented as illustrated in FIG. 5.

In the memory system according to the first embodiment illustrated in FIGS. 2 to 4, the ZQ calibration terminal TZQ of each of the memory physical layer circuits 50_1, 50_2, 50_3, . . . , 50_n is wired-OR connected inside the SoC 10 and then connected to the single reference resistor 30 via the single pad 20. In contrast, in the modification illustrated in FIG. 5, dedicated pads 20_1, 20_2, 20_3, . . . , 20_n are provided for the ZQ calibration terminals TQZ of the memory physical layer circuits 50_1, 50_2, 50_3, . . . , 50_n, respectively, and each ZQ calibration terminal TZQ is wired-OR connected on the package substrate 100 outside the SoC 10 via the dedicated pads 20_1, 20_2, 20_3, . . . , 20_n, respectively, and then connected to the single reference resistor 30 via the single solder ball 15.

The configuration other than the above is the same as that of the memory system according to the first embodiment.

In the modification of the memory system according to the first embodiment, since the number of reference resistors 30 disposed on the printed circuit board 1000 can be reduced, the area of the printed circuit board 1000 can be reduced, and the cost required for manufacturing the memory system can also be reduced.

Further, since each ZQ calibration terminal TZQ is wired-OR connected on the package substrate 100 outside the SoC 10 via the dedicated pads 20_1, 20_2, 20_3, . . . , 20_n, respectively, and then connected to the single reference resistor 30 via the single solder ball 15, a plurality of wirings for connecting to the reference resistor 30 are provided on the package substrate 100 outside the SoC 10. Therefore, it is advantageous when it is desired to reduce the area of the SoC 10.

(ZQ Calibration Process)

Figure 6:
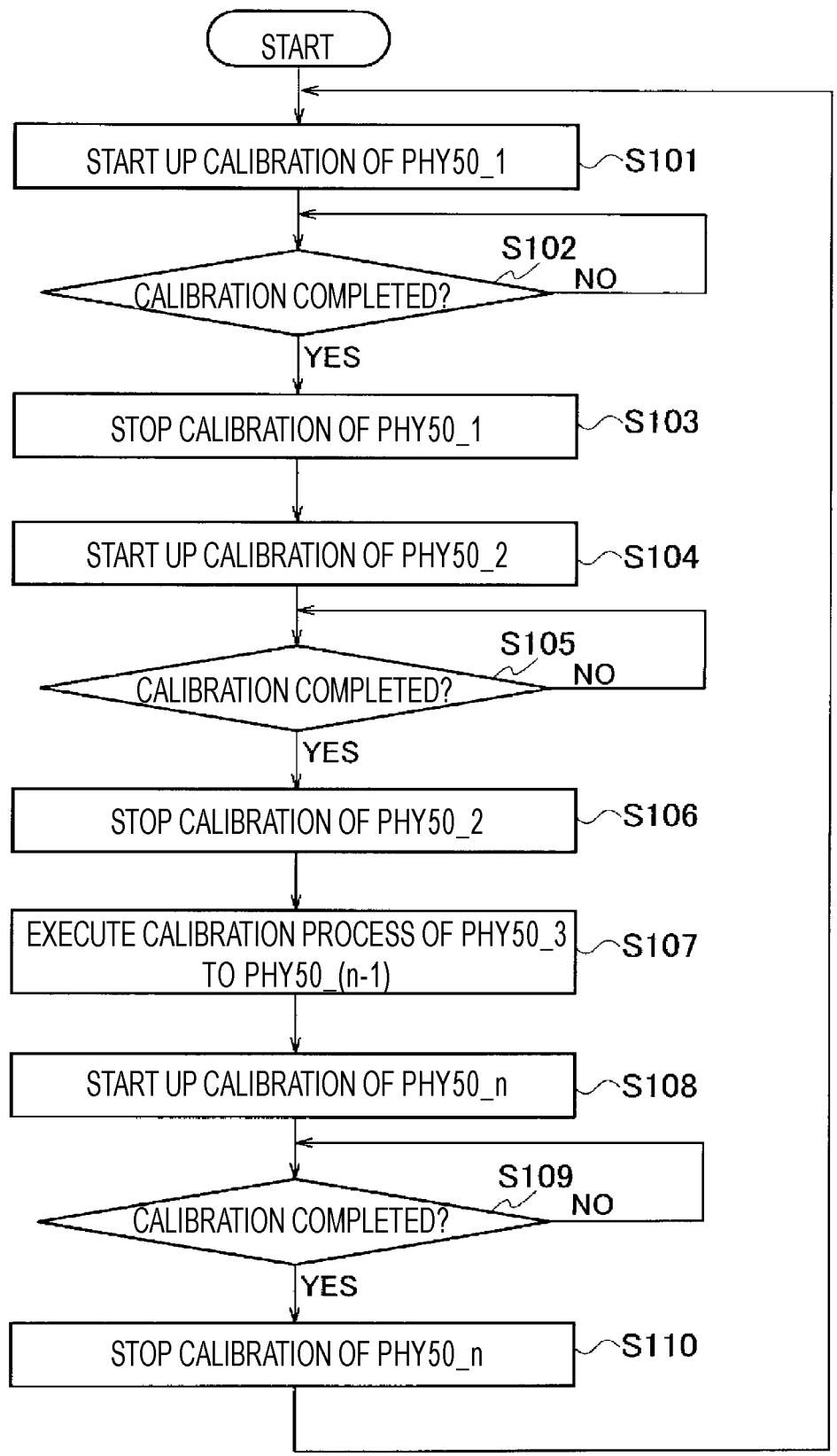
FIG. 6 is a flowchart illustrating a ZQ calibration process in the memory system according to the first embodiment.

The ZQ calibration process of the memory system according to the first embodiment is represented by the flowchart schematically illustrated in FIG. 6.

The processor 60 sequentially switches the ZQ calibration execution time of each of the memory physical layer circuits 50_1, 50_2, 50_3, . . . , 50_n in a time division manner using the control signals CAL_1, CAL_2, CAL_3, . . . , CAL_n, thereby enabling the ZQ calibration of the plurality of memory physical layer circuits 50_1, 50_2, 50_3, . . . , 50_n using the single reference resistor 30.

More specifically, as illustrated in FIG. 6, in step S101, the processor 60 transmits a control signal CAL_1 to the memory physical layer circuit 50_1 to instruct execution of ZQ calibration. The control signal CAL_1 is input to the TCA of the memory controller 40_1. The ZQC 80_1 of the memory physical layer circuit 50_1 performs the ZQ calibration of the memory physical layer circuit 50_1 using the single reference resistor 30 according to the control signal CAL_1.

In step S102, the processor 60 waits for the ZQ calibration process of the memory physical layer circuit 50_1 to complete.

When the ZQ calibration process of the memory physical layer circuit 50_1 is completed, in step S103, the processor 60 transmits the control signal CAL_1 and instructs to stop the ZQ calibration process of the memory physical layer circuit 50_1. The ZQC 80_1 of the memory physical layer circuit 50_1 stops the ZQ calibration process of the memory physical layer circuit 50_1 according to the control signal CAL_1. Note that although an example is illustrated in which the start/stop of the ZQ calibration process is instructed using the control signal CAL_1 of 1 bit (i.e., ON/OFF), different signals may be used for the start instruction and the stop instruction.

That is, the time period from step S101 to S103 is the ZQ calibration execution time of the memory physical layer circuit 50_1 assigned in a time division manner by the processor 60.

Subsequently, in step S104, the processor 60 transmits the control signal CAL_2 to the memory physical layer circuit 50_2 to instruct the execution of the ZQ calibration. The control signal CAL_2 is input to the TCA of the memory controller 40_2. The ZQC 80_2 of the memory physical layer circuit 50_2 performs a ZQ calibration of the memory physical layer circuit 50_2 using the single reference resistor 30 according to the control signal CAL_2.

In step S105, the processor 60 waits for the ZQ calibration process of the memory physical layer circuit 50_2 to complete.

When the ZQ calibration process of the memory physical layer circuit 50_2 is completed, in step S106, the processor 60 transmits the control signal CAL_2 and instructs to stop the ZQ calibration process of the memory physical layer circuit 50_2. The ZQC 80_2 of the memory physical layer circuit 50_2 stops the ZQ calibration process of the memory physical layer circuit 50_2 according to the control signal CAL_2. Note that although an example is illustrated in which the start/stop of the ZQ calibration process is instructed using the control signal CAL_2 of 1 bit (i.e., ON/OFF), different signals may be used for the start instruction and the stop instruction.

That is, the time period from step S104 to step S106 is the ZQ calibration execution time of the memory physical layer circuit 50_2 assigned in a time division manner by the processor 60.

Thereafter, similarly, the processor 60 sequentially switches the ZQ calibration execution time of each of the memory physical layer circuits 50_3 to 50_(n-1) using the control signal CAL_3 to the control signal CAL_(n-1) in a time division manner, thereby causing the ZQ calibration processes of the plurality of memory physical layer circuits 50_3 to 50_(n-1) using the single reference resistor 30 to be executed (step S107).

Subsequently, in step S108, the processor 60 transmits the control signal CAL n to the memory physical layer circuit 50_n to instruct the execution of the ZQ calibration process. The control signal CAL_n is input to the TCA of the memory controller 40_n. The ZQC 80_n of the memory physical layer circuit 50_n performs the ZQ calibration process of the memory physical layer circuit 50_n using the single reference resistor 30 according to the control signal CAL_n.

In step S109, the processor 60 waits for the ZQ calibration process of the memory physical layer circuit 50_n to complete.

When the ZQ calibration process of the memory physical layer circuit 50_n is completed, in step S110, the processor 60 transmits the control signal CAL_n and instructs to stop the ZQ calibration process of the memory physical layer circuit 50_n. The ZQC 80_n of the memory physical layer circuit 50_n stops the ZQ calibration process of the memory physical layer circuit 50_n according to the control signal CAL_n, and the processor 60 returns the process to step S101. Note that although an example is illustrated in which the start/stop of the ZQ calibration process is instructed using the control signal CAL n of 1 bit (i.e., ON/OFF), different signals may be used for the start instruction and the stop instruction.

That is, the time period from step S108 to step S110 is the execution time of the ZQ calibration process of the memory physical layer circuit 50_n assigned in a time division manner by the processor 60.

Further, information regarding the order to perform the ZQ calibration process maybe stored in a control register (not illustrated) or the like in the SoC 10, and the processor 60 performs a time division control while referring to the control register.

As described above, in the memory system and the modification thereof according to the first embodiment, even when the number of reference resistors 30 connected to the outside of the controller 10 in the memory system having the nonvolatile memories 90 connected to a plurality of channels is reduced, the ZQ calibration process of the memory physical layer circuit 50 of each channel can be performed efficiently and effectively.

Second Embodiment

The ZQ calibration process is required to be performed with high frequency according to the voltage fluctuation rate and the temperature fluctuation rate in the memory system. Therefore, for example, when the time required for the ZQ calibration process of one channel becomes longer, the time required for the ZQ calibration process of all channels becomes longer than, for example, an interval of the ZQ calibration process recommended by the JEDEC. Thus, when the process is sequentially performed in a time division manner as in the memory system according to the first embodiment, there is a possibility that the ZQ calibration process cannot be performed at an appropriate frequency. For example, in a case where the interval of the recommended ZQ calibration process is several hundred milliseconds (ms) and the time required for one channel ZQ calibration process is several tens of ms, when the number of channels exceeds ten, it becomes difficult to perform the ZQ calibration process at the recommended interval.

Thus, in the memory system according to the second embodiment, a logical group is formed by adjacent channels having similar VT conditions. Then, the execution time of the ZQ calibration process of the memory physical layer circuit 50 is sequentially switched in a time division manner for each group. Then, the ZQ calibration process of a plurality of memory physical layer circuits 50 by a single reference resistor 30 is performed for each group. This enables the ZQ calibration process at an appropriate frequency, for example, a frequency recommended in the JEDEC standard.

In addition, a calibration of one group (e.g., a group using the reference resistor 30_1 in FIG. 7), a calibration of another group (e.g., a group using the reference resistor 30_2 in FIG. 7), and a calibration of still another group (e.g., a group using the reference resistor 30_m in FIG. 7) can be performed simultaneously in parallel.

Figure 7:
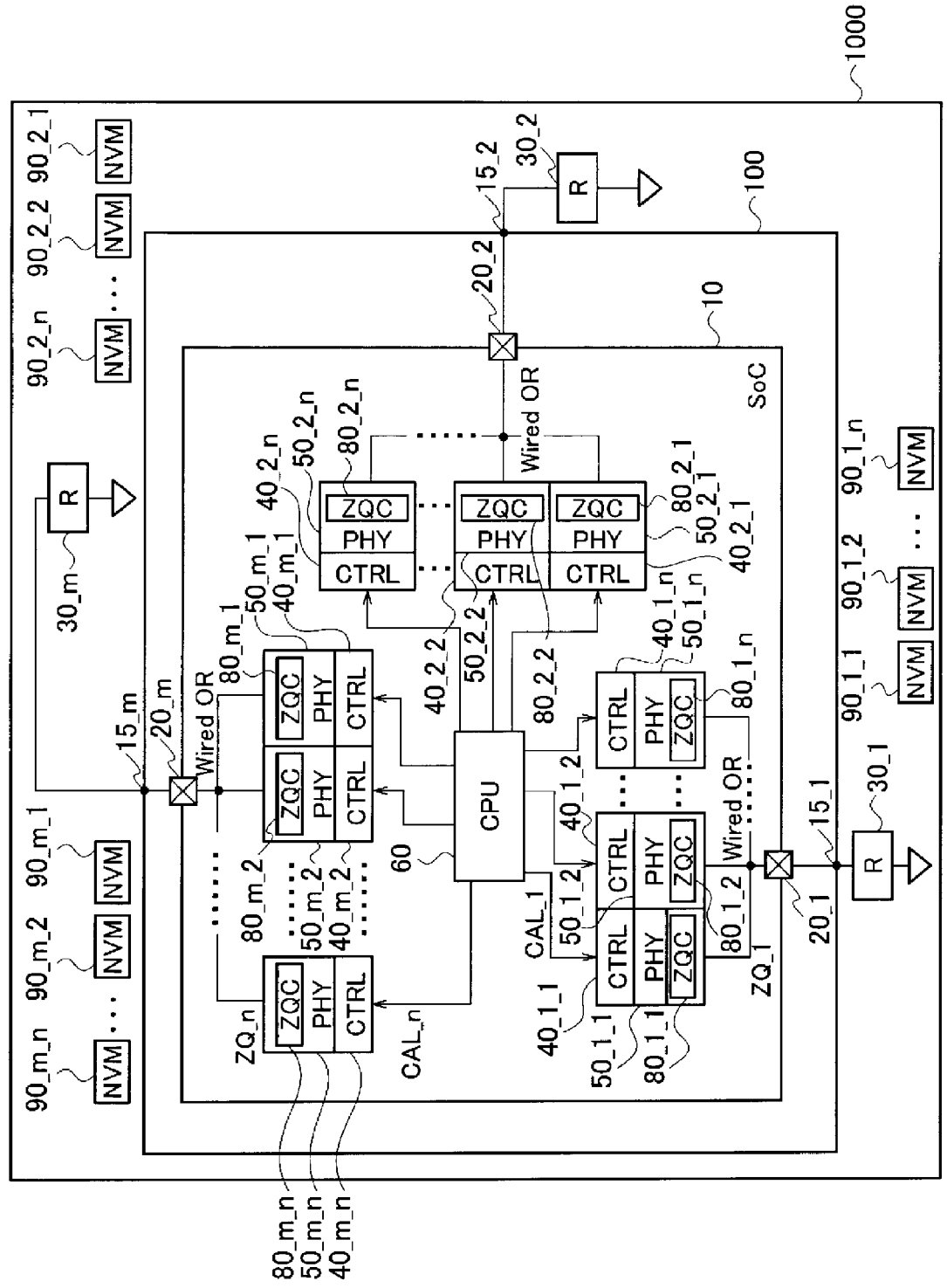
FIG. 7 is a schematic block configuration diagram of a memory system according to a second embodiment.

The block configuration of the memory system according to the second embodiment is schematically represented as illustrated in FIG. 7.

The memory system according to the second embodiment includes a printed circuit board 1000, nonvolatile memories 90 (90_1_1, 90_1_2, . . . , 90_1_n), (90_2_1, 90_2_2, . . . , 90_2_n), . . . , (90_m_1, 90_m_2, . . . , 90_m_n) disposed on the printed circuit board 1000, a package substrate 100 disposed on the printed circuit board 1000, and an SoC 10 disposed on the package substrate 100. The nonvolatile memory 90 and the SoC 10 are connected to each other through a plurality of channels.

The SoC 10 includes a plurality of (here, m×n) memory physical layer circuits (50_1_1, 50_1_2, . . . , 50_1_n), (50_2_1, 50_2_2, . . . , 50_2_n), . . . , (50_m_1, 50_m_2, . . . , 50_m_n) which are arranged corresponding to the plurality of channels, respectively, a plurality of (here, m×n) memory controllers (40_1_1, 40_1_2, . . . , 40_1_n), (40_2_1, 40_2_2, . . . , 40_2_n), . . . , (40_m_1, 40_m_2, . . . , 40_m_n) which control the plurality of memory physical layer circuits (50_1_1, 50_1_2, . . . , 50_1_n), (50_2_1, 50_2_2, . . . , 50_2_n), . . . , (50_m_1, 50_m_2, . . . , 50_m_n), respectively, a plurality of (here, m) ZQ calibration pads 20_1, 20_2, . . . , 20_m, and the processor 60 (CPU) which controls each part of the SoC 10.

The memory system according to the second embodiment further includes a plurality of (here, m) reference resistors for ZQ calibration (R) 30_1, 30_2, ..., 30_m, which are connected to the memory physical layer circuits (50_1_1, 50_1_2, ..., 50_1_n), (50_2_1, 50_2_2, ..., 50_2_n), ..., (50_m_1, 50_m_2, ..., 50_m_n) via the pads 20_1, 20_2, ..., 20_m, on the printed circuit board 1000.

The memory physical layer circuits 50 and the memory controllers 40 are logically divided into groups that share one of the reference resistors 30. The ZQ calibration terminals TZQ of the n memory physical layer circuits belonging to each group are wired-OR connected inside the SoC 10 and are connected to one of the plurality of reference resistors 30 via one of the plurality of pads 20 and one of the plurality of solder balls 15. The processor 60 performs a ZQ calibration process of each memory physical layer circuit 50 in a time division method using any one of the m reference resistors 30 connected for each group.

In addition, a calibration of one group (e.g., a group using the reference resistor 30_1 in FIG. 7), a calibration of another group (e.g., a group using the reference resistor 30_2 in FIG. 7), and a calibration of still another group (e.g., a group using the reference resistor 30_m in FIG. 7) can be performed simultaneously in parallel.

More specifically, in the memory system according to the second embodiment, n×m memory controllers 40 and n×m memory physical layer circuits 50 are divided into m groups. In the example illustrated in FIG. 7, a first group is assumed to be the memory controllers 40_1_1, 40_1_2, ..., 40_1_n and the memory physical layer circuits 50_1_1, 50_1_2, ..., 50_1_n, a second group is assumed to be the memory controllers 40_2_1, 40_2_2, ..., 40_2_n and the memory physical layer circuits 50_2_1, 50_2_2, ..., 50_2_n, ..., an m-th group is assumed to be the memory controllers 40_m_1, 40_m_2, ..., 40_m_n and the memory physical layer circuits 50_m_1, 50_m_2, ..., 50_m_n.

Each of the ZQ calibration terminals TZQ of the memory physical layer circuits 50_1_1, 50_1_2, ..., 50_1_n belonging to the first group is wired-OR connected inside the SoC 10, and then connected to the single reference resistor 30_1 via the single pad 20_1 and the single solder ball 15_1. Similarly, each of the ZQ calibration terminals TZQ of the memory physical layer circuits 50_2_1, 50_2_2, ..., 50_2_n belonging to the second group is wired-OR connected inside the SoC 10, and then connected to the single reference resistor 30_2 via the single pad 20_2 and the single solder ball 15_2. Further, each of the ZQ calibration terminals TZQ of the memory physical layer circuits 50_m_1, 50_m_2, ..., 50_m_n belonging to the m-th group is wired-OR connected inside the SoC 10, and then connected to the single reference resistor 30_m via the single pad 20_m and the single solder ball 15_m.

With respect to the first group, the processor 60 sequentially switches the ZQ calibration execution time of each of the memory physical layer circuits 50_1_1, 50_1_2, ..., 50_1_n using the control signals CAL_1, CAL_2, CAL_3, ..., CAL_n in a time division manner, thereby causing the ZQ calibration processes of the plurality of memory physical layer circuits 50_1_1, 50_1_2, ..., 50_1_n using the single reference resistor 30_1 to be executed. Similarly, with respect to the second group, the processor 60 sequentially switches the ZQ calibration execution time of each of the memory physical layer circuits 50_2_1, 50_2_2, ..., 50_2_n using the control signals CAL_1, CAL_2, CAL_3, ..., CAL_n in a time division manner, thereby causing the ZQ calibration processes of the plurality of memory physical layer circuits 50_2_1, 50_2_2, ..., 50_2_n using the single reference resistor 30_2 to be executed. Further, with respect to the m-th group, the processor 60 sequentially switches the ZQ calibration execution time of each of the memory physical layer circuits 50_m_1, 50_m_2, ..., 50_m_n using the control signals CAL_1, CAL_2, CAL_3, ..., CAL_n in a time division manner, thereby causing the ZQ calibration processes of the plurality of memory physical layer circuits 50_m_1, 50_m_2, ..., 50_m_n using the single reference resistor 30_m to be executed.

The memory physical layer circuits 50_1_1, 50_1_2, ..., 50_1_n belonging to the first group include ZQCs 80_1_1, 80_1_2, ..., 80_1_n, respectively. Each of the ZQCs 80_1_1, 80_1_2, ..., 80_1_n performs the ZQ calibration process using the single reference resistor 30_1 within the execution time of the ZQ calibration process assigned to each by the processor 60. As a result, the on-resistor Ron and the termination resistor Rtt of each of the memory physical layer circuits 50_1_1, 50_1_2, ..., 50_1_n are calibrated according to the respective VT conditions. Similarly, the memory physical layer circuits 50_2_1, 50_2_2, ..., 50_2_n belonging to the second group include ZQCs 80_2_1, 80_2_2, ..., 80_2_n, respectively. Each of the ZQCs 80_2_1, 80_2_2, ..., 80_2_n performs the ZQ calibration process using the single reference resistor 30_2 within the execution time of the ZQ calibration process assigned to each by the processor 60. As a result, the on-resistor Ron and the termination resistor Rtt of each of the memory physical layer circuits 50_2_1, 50_2_2, ..., 50_2_n are calibrated according to the respective VT conditions. Further, the memory physical layer circuits 50_m_1, 50_m_2, ..., 50_m_n belonging to the m-th group include ZQCs 80_m_1, 80_m_2, ..., 80_m_n, respectively. Each of the ZQCs 80_m_1, 80_m_2, ..., 80_m_n performs the ZQ calibration process using the single reference resistor 30_m within the execution time of the ZQ calibration process assigned to each by the processor 60. As a result, the on-resistor Ron and the termination resistor Rtt of each of the memory physical layer circuits 50_m_1, 50_m_2, ..., 50_m_n are calibrated according to the respective VT conditions.

As described above, in the memory system according to the second embodiment, the following operational effects can be brought about in addition to the operational effects of the memory system according to the first embodiment. That is, in the memory system according to the second embodiment, the ZQ calibration execution time of the memory physical layer circuit 50 is sequentially switched in a time division manner for each of the first to m-th groups, not the entire SoC 10, and the ZQ calibration process of the plurality of memory physical layer circuits 50 using the single reference resistor 30 for each group is thereby implemented. Thus, even when the time required for the ZQ calibration process of one channel becomes longer, the ZQ calibration process can be performed at a recommended interval.

Further, since the number of the pads 20 disposed on the SoC 10, the number of the solder balls 15 disposed on the package substrate 100, and the number of the reference resistor 30 disposed on the printed circuit board 1000 can be kept at one per group, the area of the SoC 10, the package substrate 100, and the printed circuit board 1000 can be reduced, and the cost required for manufacturing the memory system can also be reduced.

(Modification)

Figure 8:
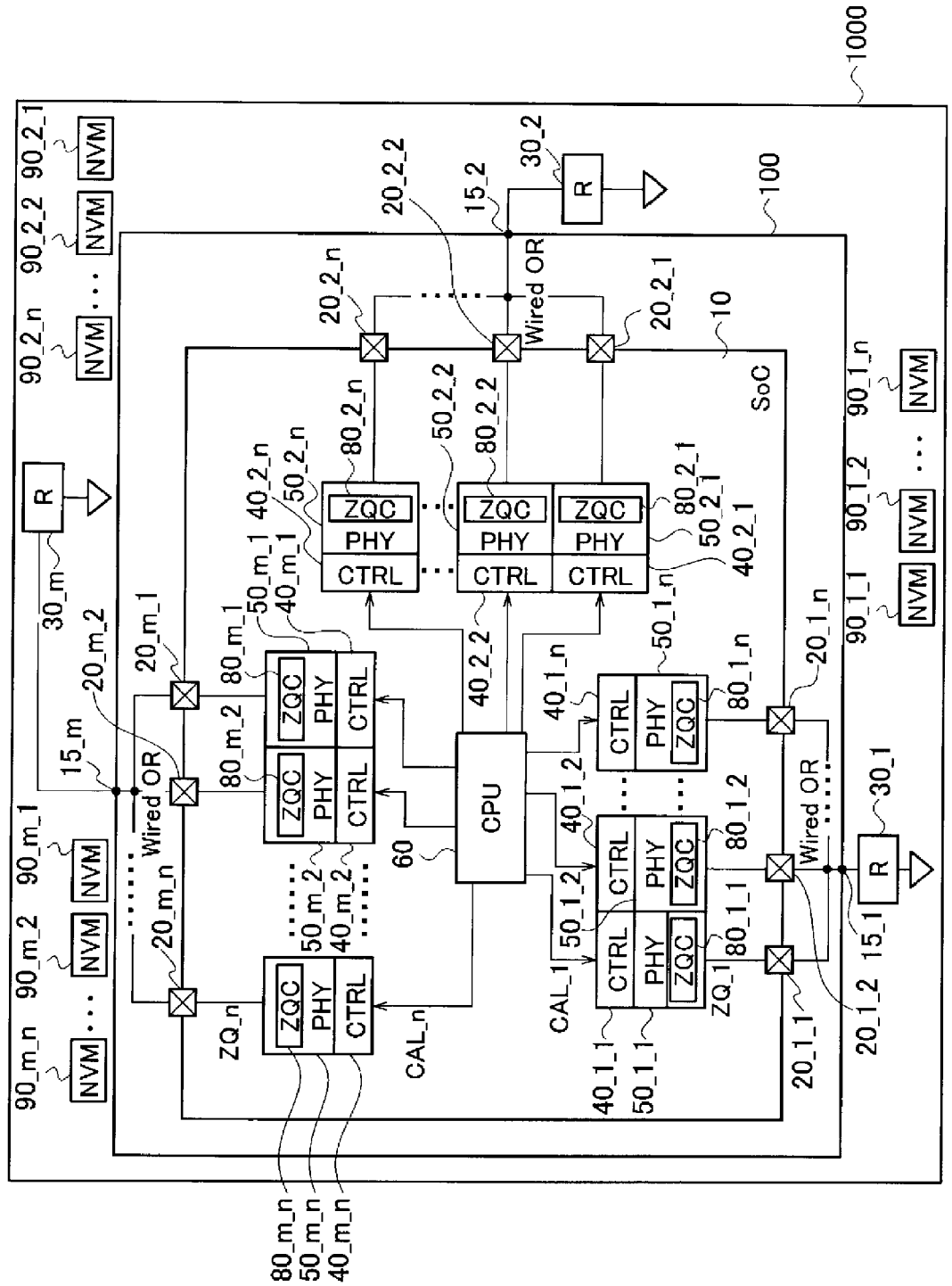
FIG. 8 is a schematic block diagram of a memory system according to a modification of the second embodiment.

A block configuration of a modification of the memory system according to the second embodiment is schematically represented as illustrated in FIG. 8.

In the memory system according to the second embodiment illustrated in FIG. 7, the ZQ calibration terminals TZQ of the memory physical layer circuits belonging to each group are wired-OR connected inside the SoC 10 and then connected to the single reference resistor 30 via the single pad 20. In contrast, in the modification illustrated in FIG. 8, a dedicated pad 20 is provided for each ZQ calibration terminal TZQ, and each ZQ calibration terminal TZQ is wired-OR connected to the solder ball 15 on the package substrate 100 outside the SoC 10 via the dedicated pad 20, and connected to a reference resistor 30 for each group.

More specifically, with respect to a first group, dedicated pads 20_1_1, 20_1_2, ..., 20_1_n are provided for the ZQ calibration terminals TZQ of the memory physical layer circuits 50_1_1, 50_1_2, ..., 50_1_n, respectively, each of the ZQ calibration terminals TZQ is wired-OR connected on the package substrate 100 outside the SoC 10 via the dedicated pads 20_1_1, 20_1_2, ..., 20_1_n, and then connected to a first group reference resistor 30_1 via the solder ball 15_1. Similarly, with respect to a second group, dedicated pads 20_2_1, 20_2_2, ..., 20_2_n are provided for the ZQ calibration terminals TZQ of the memory physical layer circuits 50_2_1, 50_2_2, ..., 50_2_n, respectively, each of the ZQ calibration terminals TZQ is wired-OR connected on the package substrate 100 outside the SoC 10 via the dedicated pads 20_2_1, 20_2_2, ..., 20_2_n, and then connected to a second group reference resistor 30_2 via the solder ball 15_2. Further, with respect to an m-th group, dedicated pads 20_m_1, 20_2_m, ..., 20_m_n are provided for the ZQ calibration terminals TZQ of the memory physical layer circuits 50_m_1, 50_m_2, ..., 50_m_n, respectively, each of the ZQ calibration terminals TZQ is wired-OR connected on the package substrate 100 outside the SoC 10 via the dedicated pads 20_m_1, 20_m_2, ..., 20_m_n, and then connected to an m-th group reference resistor 30_m via the solder ball 15_m.

The configuration other than the above is the same as that of the memory system according to the second embodiment.

In the modification of the memory system according to the second embodiment, since the number of reference resistors 30 disposed on the printed circuit board 1000 can be reduced to the same number as the number of groups, the area of the printed circuit board 1000 can be reduced, and the cost required for manufacturing the memory system can also be reduced.

Further, since each ZQ calibration terminal TZQ is wired-OR connected to the solder ball 15 on the package substrate 100 outside the SoC 10 via the dedicated pads 20_1_1, 20_1_2, ..., 20_1_n, 20_2_1, 20_2_2, ..., 20_2_n, ..., 20_m_1, 20_m_2, ..., 20_m_n, respectively, and connected to the reference resistors 30_1, 30_2, ..., 30_m, a plurality of wirings for connecting to the reference resistor 30 are provided on the package substrate 100 outside the SoC 10. Therefore, it is advantageous when it is desired to reduce the area of the SoC 10.

(ZQ Calibration Process)

Figure 9:
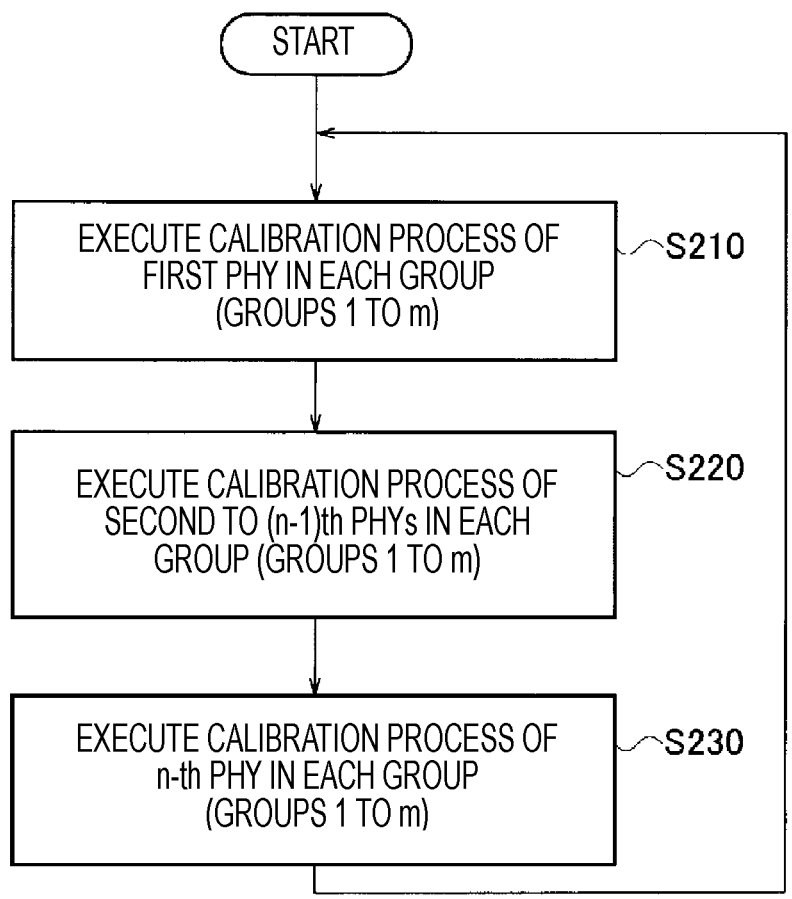
FIG. 9 is a flowchart illustrating a ZQ calibration process in the memory system according to the second embodiment.

The ZQ calibration process of the memory system according to the second embodiment is represented by the flowchart schematically illustrated in FIG. 9.

The processor 60 sequentially switches the execution time of the ZQ calibration process for each group, that is, for each of the first to m-th groups, in a time division manner, thereby enabling the ZQ calibration processes of the plurality of memory physical layer circuits 50 using the single reference resistor 30.

Specifically, as illustrated in FIG. 9, in step S210, the processor 60 performs the ZQ calibration process of the first memory physical layer circuit 50_1_1, the first memory physical layer circuit 50_2_1, ..., the first memory physical layer circuit 50_m_1 in each of the first to m-th groups. Similarly, in step S220, the processor 60 performs the ZQ calibration process from the second memory physical layer circuit 50_1_2, the second memory physical layer circuit 50_2_2, ..., the second memory physical layer circuit 50_m_2 in each of the first to m-th groups, to the (n-1)th memory physical layer circuit 50_1_(n-1), the (n-1) th memory physical layer circuit 50_2_(n-1), ..., the (n-1)th memory physical layer circuit 50_m_(n-1) in each of the first to m-th groups. Further, in step S230, the processor 60 performs the ZQ calibration process of the n-th memory physical layer circuit 50_1_n, the n-th memory physical layer circuit 50_2_n, the n-th memory physical layer circuit 50_m_n in each of the first to m-th groups.

When the ZQ calibration process of the n-th memory physical layer circuit 50_1_n, the n-th memory physical layer circuit 50_2_n, ..., the n-th memory physical layer circuit 50_m_n in each of the first to m-th groups is completed in step S230, the processor 60 returns the process to step S210.

Figure 10:
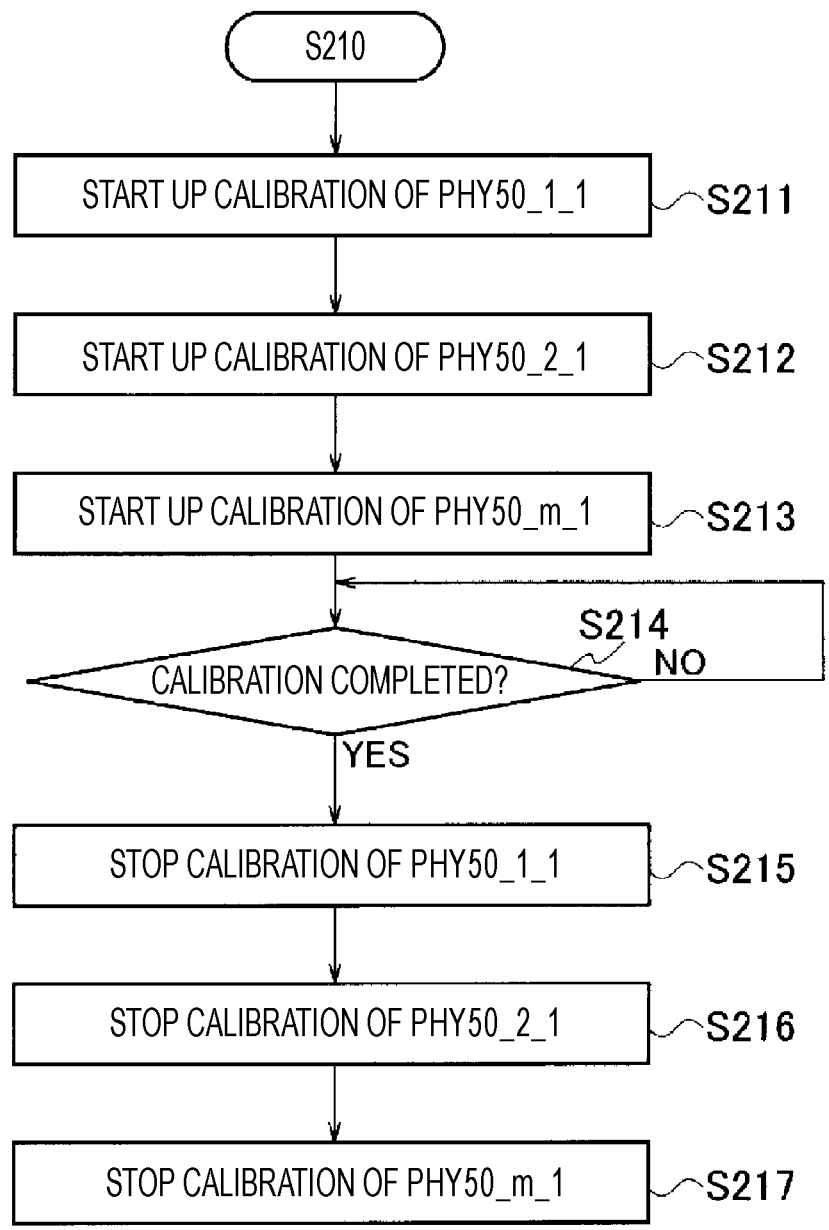
FIG. 10 is a flowchart illustrating details of step S210 in the ZQ calibration process illustrated in FIG. 9.

FIG. 10 is a flowchart illustrating details of step S210 in the ZQ calibration process illustrated in FIG. 9.

As illustrated in FIG. 10, in steps 211 to S213, the processor 60 instructs execution of the ZQ calibration process of the first memory physical layer circuit 50_1_1, the first memory physical layer circuit 50_2_1, ..., the first memory physical layer circuit 50_m_1 in each of the first to m-th groups. The ZQC 80_1_1, the ZQC 80_2_1, ..., the ZQC 80_m_1 of the memory physical layer circuit 50_1_1, the memory physical layer circuit 50_2_1, ..., the memory physical layer circuit 50_m_1, respectively, perform the ZQ calibration process. Further, steps 5211 to 5213 can be performed in parallel.

In step S214, the processor 60 waits for the ZQ calibration process of the memory physical layer circuit 50_1_1, the memory physical layer circuit 50_2_1, ..., the memory physical layer circuit 50_m_1 to complete.

When the ZQ calibration process of the memory physical layer circuit 50_1_1, the memory physical layer circuit 50_2_1, ..., the memory physical layer circuit 50_m_1 is completed, the processor 60 instructs to stop the ZQ calibration process of the memory physical layer circuit 50_1_1, the memory physical layer circuit 50_2_1, ..., and the memory physical layer circuit 50_m_1. The ZQC 80_1_1, the ZQC 80_2_1, ..., the ZQC 80_m_1 stop the ZQ calibration process. Further, steps S215 to S217 can also be performed in parallel.

Figure 11:
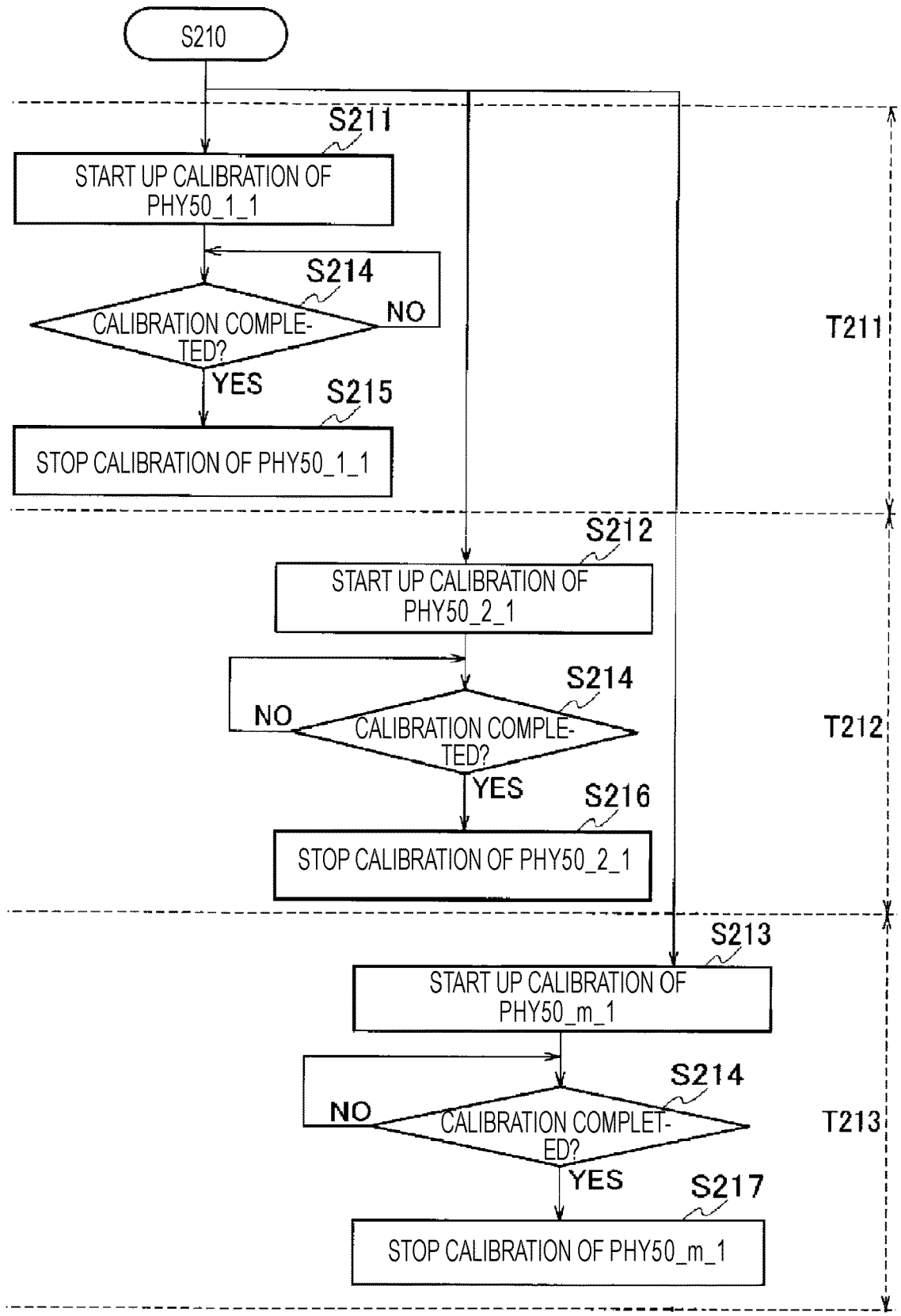
FIG. 11 is a flowchart illustrating another detail of step S210 in the ZQ calibration process illustrated in FIG. 9.

That is, as illustrated in FIG. 11, a time zone T211 of steps S211, S214, and S215 is an execution time of the ZQ calibration process of the memory physical layer circuit 50_1_1 assigned in a time division manner by the processor 60. A time zone T212 of steps S212, S214, and S216 is an execution time of the ZQ calibration process of the memory physical layer circuit 50_2_1 assigned in a time division manner by the processor 60. A time zone T213 of steps S213, S214, and S217 is an execution time of the ZQ calibration process of the memory physical layer circuit 50_m_1 assigned in a time division manner by the processor 60. Further, FIG. 11 represents an example in which the time zones T211, T212, and T213 are arranged in series to simplify the description. However, the present disclosure is not limited thereto, and a part or all of the time zones T211, T212, and T213 can overlap with each other. That is, the above ZQ calibration process can be performed in parallel in the same time zone.

Figure 12:
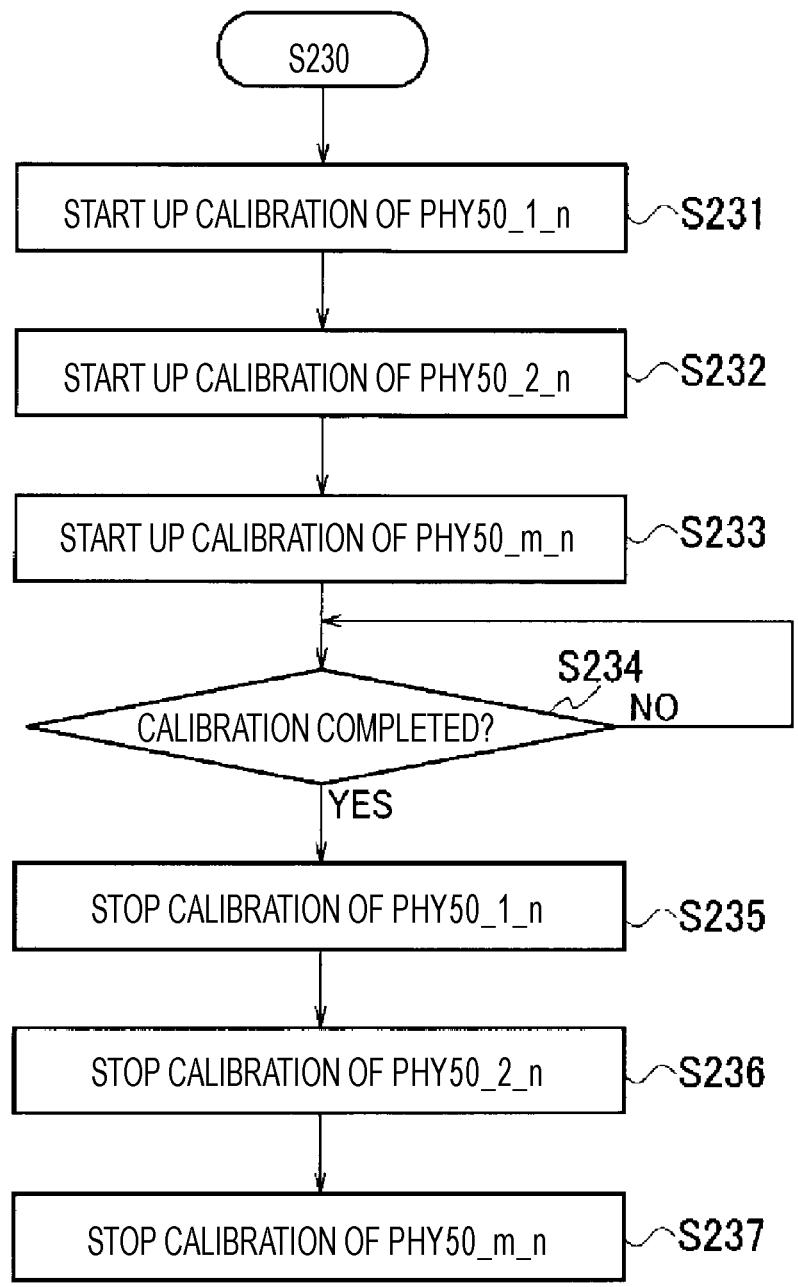
FIG. 12 is a flowchart illustrating details of step S230 in the ZQ calibration process illustrated in FIG. 9.

FIG. 12 is a flowchart illustrating details of step S230 in the ZQ calibration process illustrated in FIG. 9.

As illustrated in FIG. 12, in steps S231 to S233, the processor 60 instructs the execution of the ZQ calibration process of the n-th memory physical layer circuit 50_1_n, the n-th memory physical layer circuit 50_2_n, . . . , the n-th memory physical layer circuit 50_m_n in each of the first to m-th groups. The ZQC 80_1_n, the ZQC 80_2_n, . . . , the ZQC 80_m_n of the memory physical layer circuit 50_1_n, the memory physical layer circuit 50_2_n, . . . , the memory physical layer circuit 50_m_n, respectively, perform the ZQ calibration process. Further, steps 231 to S233 can be performed in parallel.

In step S234, the processor 60 waits for the ZQ calibration process of the memory physical layer circuit 50_1_n, the memory physical layer circuit 50_2_n, . . . , the memory physical layer circuit 50_m_n to complete.

When the ZQ calibration process of the memory physical layer circuit 50_1_n, the memory physical layer circuit 50_2_n, . . . , the memory physical layer circuit 50_m_n is completed, in steps 235 to S237, the processor 60 instructs to stop the ZQ calibration process of the memory physical layer circuit 50_1_n, the memory physical layer circuit 50_2_n, . . . , the memory physical layer circuit 50_m_n. The ZQC 80_1_n, the ZQC 80_2_n, . . . , the ZQC 80_m_n stop the ZQ calibration process. Further, steps S235 to S237 can also be performed in parallel.

Figure 13:
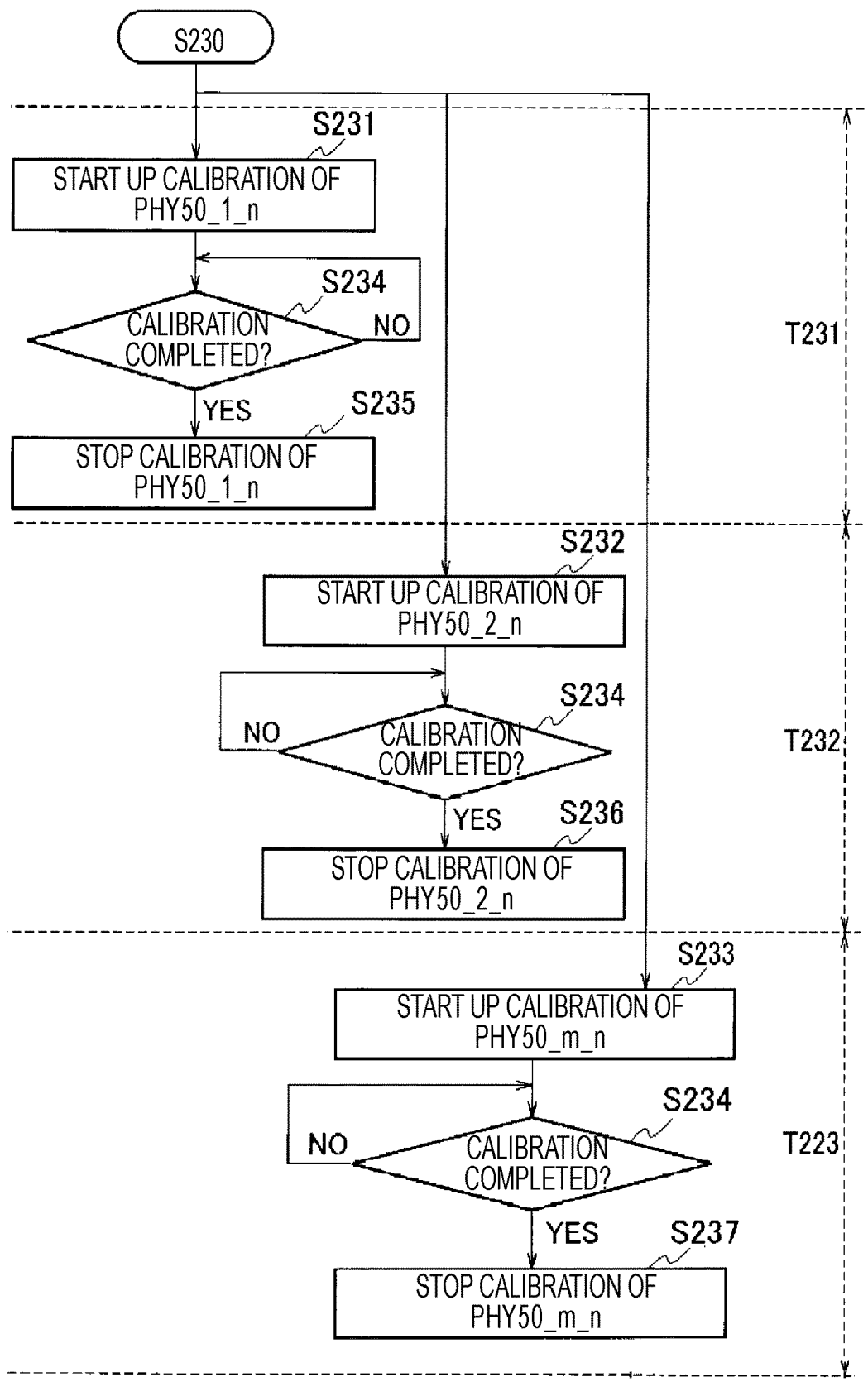
FIG. 13 is a flowchart illustrating other details of step S230 in the ZQ calibration process illustrated in FIG. 9.

That is, as illustrated in FIG. 13, a time zone T231 of step S231, step S234, and step S235 is an execution time of the ZQ calibration process of the memory physical layer circuit 50_1_n assigned in a time division manner by the processor 60. A time zone T232 of steps 5232, 5234, and 5236 is an execution time of the ZQ calibration process of the memory physical layer circuit 50_2_n assigned in a time division manner by the processor 60. A time zone T233 of steps S233, S234, and S237 is an execution time of the ZQ calibration process of the memory physical layer circuit 50_m_n assigned in a time division manner by the processor 60. Further, FIG. 13 represents an example in which the time zones T231, T232, and T233 are arranged in series to simplify the description. However, the present disclosure is not limited thereto, and a part or all of the time zones T231, T232, and T233 can overlap with each other. That is, the above ZQ calibration process can be performed in parallel in the same time zone.

As described above, in the memory system and the modification thereof according to the second embodiment, even when the number of reference resistors 30 connected to the outside of the controller 10 in the memory system having the nonvolatile memory connected to the plurality of channels is reduced, the ZQ calibration process of the memory physical layer circuit 50 of each channel can be performed efficiently and effectively.

In particular, in the memory system according to the second embodiment, the ZQ calibration process can be performed at an appropriate frequency while reducing the manufacturing cost of the memory system.

Third Embodiment

Since the VT conditions of adjacent memory physical layer circuits (PHY) tend to be similar to each other, even when the ZQ calibration process is performed for each of the adjacent memory physical layer circuits, the results thereof may be often the same. Therefore, in the memory system according to the third embodiment, a logical group is formed by adjacent channels having similar VT conditions, a representative channel is selected from the channels in the group, and the ZQ calibration process is performed only for the selected representative channel. Then, the ZQ calibration results performed for the representative channel are shared by each channel in the group. That is, channels other than the representative channel in the group are used with reference to the calibration results of the representative channel. This enables the ZQ calibration process at an appropriate frequency, for example, a frequency recommended in the JEDEC standard.

Figure 14:
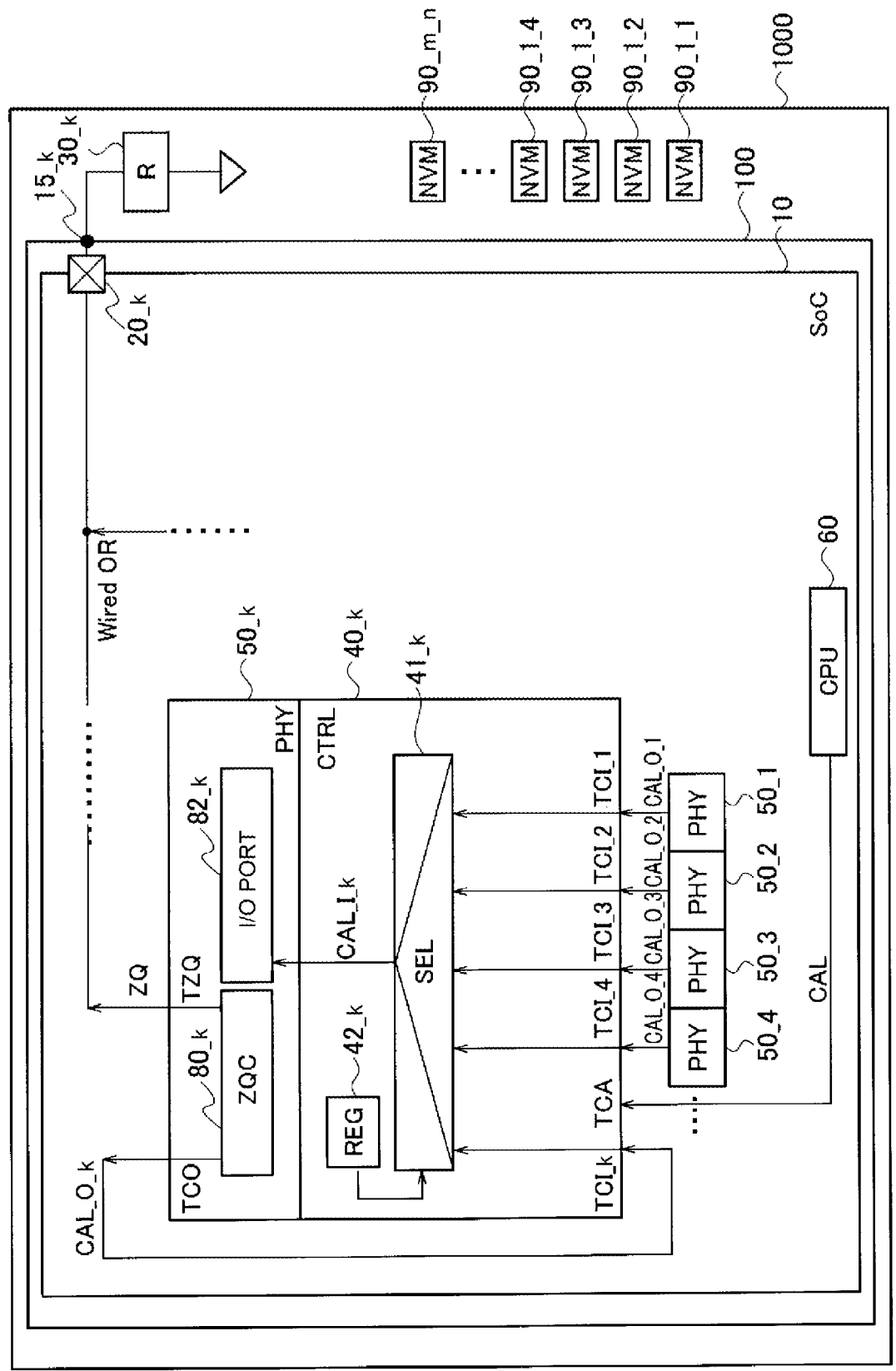
FIG. 14 is a partial schematic block diagram of one group of a memory system according to a third embodiment.

A partial block configuration example in one group of the memory system according to the third embodiment is schematically illustrated in FIG. 14. FIG. 14 illustrates a block configuration example focusing on the k-th memory physical layer circuit 50_k and the k-th memory controller 40_k of one group for easy understanding.

As illustrated in FIG. 14, the memory controller 40_k includes an one-to-n selector (SEL) 41_k connected so that calibration results of all the memory physical layer circuits 50_1 to 50_n in the group are input thereto, and a register (REG) 42_k in which information indicating which memory physical layer circuit of the memory physical layer circuits 50_1 to 50_n in the group is selected as a representative channel is stored. The memory controller 40_k is connected to all the memory physical layer circuits 50_1 to 50_n in the group including its own memory physical layer circuit 50_k so that any of the memory physical layer circuits 50_1 to 50_n in the group can be the representative channel. That is, calibration results CAL_O_1 to CAL_O_n output from calibration result outputs TCO of all the memory physical layer circuits 50_1 to 50_n in the group are connected to calibration inputs TCI_1 to TCI_n of the memory controller 40_k.

The selector 41_k in the memory controller 40_k selects the calibration result of the representative channel from the calibration results CAL_O_1 to CAL_O_n based on the information in the register 42_k, and sends such a result to an input/output port 82_k of the memory physical layer circuit 50_k.

Figure 15:
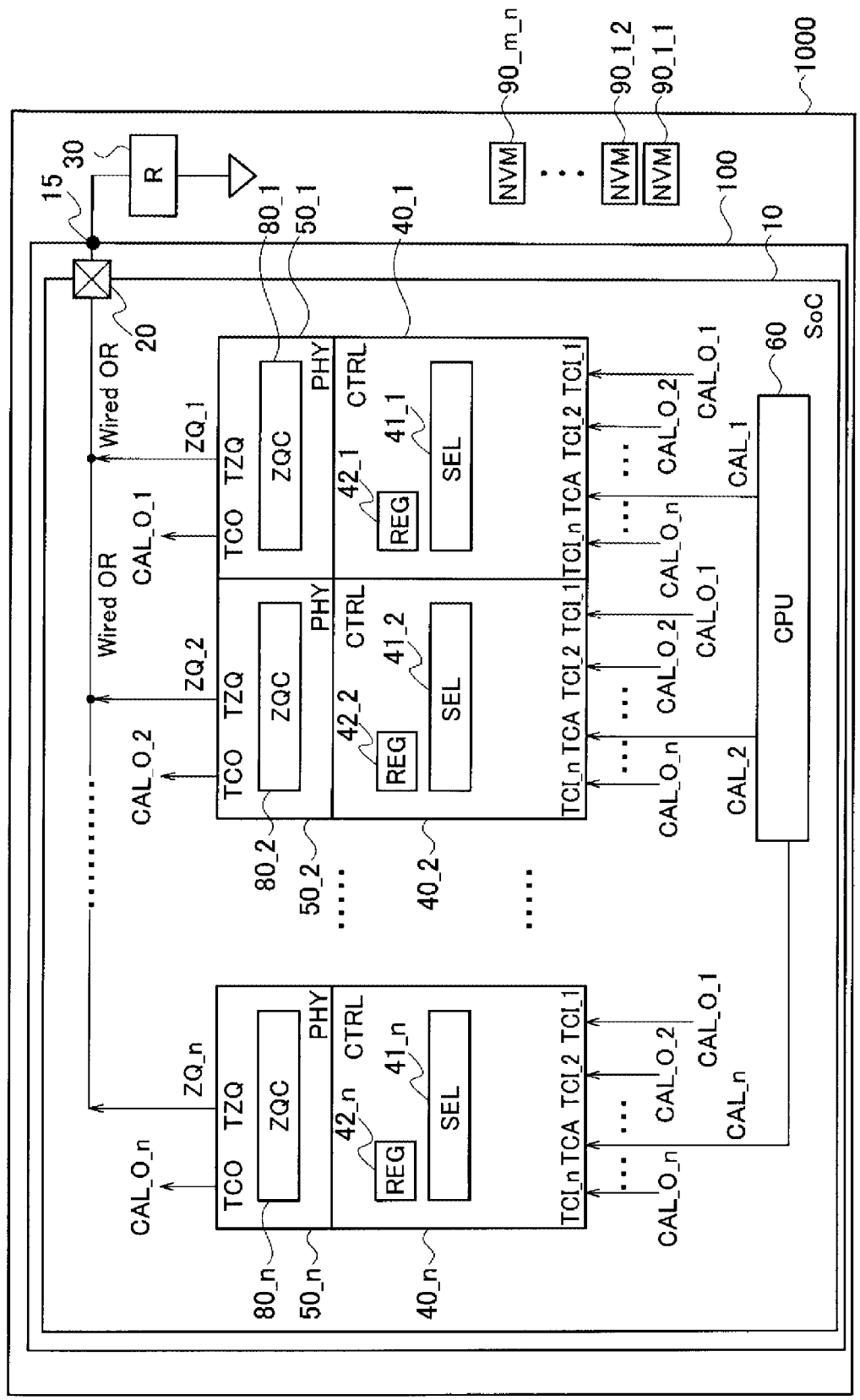
FIG. 15 is an overall schematic block diagram of one group of the memory system according to the third embodiment.

FIG. 15 illustrates an overall schematic block configuration in one group of the memory system according to the third embodiment.

As illustrated in FIG. 15, the memory system according to the third embodiment includes a printed circuit board 1000, nonvolatile memories 90 (90_1_1, 90_1_2, 90_1_3, . . . , 90_m_n) disposed on the printed circuit board 1000, a package substrate 100 disposed on the printed circuit board 1000, and an SoC 10 disposed on the package substrate 100. The nonvolatile memories 90 and the SoC 10 are connected to each other through a plurality of channels.

The SoC 10 includes, per group among m groups, n memory physical layer circuits 50 (50_1, 50_2, . . . , 50_n) arranged corresponding to the plurality of channels, respectively, n memory controllers 40 (40_1, 40_2, . . . , 40_n) that control the memory physical layer circuits 50 (50_1, 50_2, . . . , 50_n), respectively, a pad 20 for ZQ calibration, and a processor 60 that controls each part of the SoC 10.

The memory system according to the third embodiment further includes, per group among them groups, a ZQ calibration reference resistor 30, which is connected to each of the memory physical layer circuits 50 (50_1, 50_2, . . . , 50_n) via the pad 20 and a solder ball 15, on the printed circuit board 1000.

In the group sharing the reference resistor 30, the ZQ calibration terminal TZQ of each of the memory physical layer circuits 50 (50_1, 50_2, . . . , 50_n) is wired-OR connected inside the SoC 10 and connected to the single reference resistor 30 via the single pad 20 and the single solder ball 15. The processor 60 performs the ZQ calibration process only for the memory physical layer circuit 50 selected as the representative channel among the memory physical layer circuits 50 (50_1, 50_2, . . . , 50_n) in the group using the single reference resistor 30. The memory controller 40_k is connected to all of the memory physical layer circuits 50 (50_1, 50_2, . . . , 50_n) in the group so that any of the memory physical layer circuits 50 (50_1, 50_2, . . . , 50_n) in the group can be selected as the representative channel. That is, the calibration inputs TCI_1 to TCI_n of the memory controller 40 are connected so that the calibration results CAL_O_1 to CAL_O_n output from the calibration result outputs TCO of all the memory physical layer circuits 50_1 to 50_n in the group can be input.

Each of the memory controllers 40 (40_1, 40_2, 40_3, . . . , 40_n) in the group includes a one-to-n selector 41 (41_1, 41_2, . . . , 41_n) and a register 42 (42_1, 42_2, . . . , 42_n) that stores information indicating the representative channels of the group. The selector SEL41 in the memory controller 40 selects the calibration result of the representative channel from the calibration results CAL_O_1 to CAL_O_n based on the information in the register 42, and sends such a result to the input/output port 82 of the memory physical layer circuit 50.

Further, FIGS. 14 and 15 illustrate an example in which the registers 42 (42_1, 42_2, . . . , 42_n) are provided in the memory controllers 40 (40_1, 40_2, . . . , 40_n), respectively. However, the present disclosure is not limited thereto, and the register 42 may be disposed at any available place in the SoC 10. In that case, a single register 42 may be used.

Thus, in the memory system according to the third embodiment, adjacent channels having similar VT conditions form a logical group, a representative channel is selected from the channels in the group, and the ZQ calibration process is performed only for the selected representative channel. Then, the ZQ calibration result performed for the representative channel is shared by each channel in the group. This eliminates the need for the processor 60 to perform an exclusive control for time division control in each group, thereby reducing the load on the processor 60. Further, since it is not necessary to perform the ZQ calibration process by the time division control, the ZQ calibration process can be always performed, and the recommendation for the execution frequency of the ZQ calibration process can be satisfied.

As for a logical grouping method of sharing the reference resistor 30, a method of grouping with adjacent channels, a method of separating front and back surfaces of the printed circuit board 1000 on which the nonvolatile memories are arranged, and the like may be considered, but the present disclosure is not particularly limited to these. Further, if the I/O capability is equivalent, even a DDR SDRAM channel may also be included in the same group. Since the ZQ calibration process is an operation of calibrating by making the resistance of an internal resistor close to that of an external reference resistor 30, if the reference resistor to be used for the ZQ calibration of the nonvolatile memory 90 (e.g., NAND-type flash memory) and to be used for the ZQ calibration of the DDR SDRAM is the same, the reference register may be shared between the channel of the nonvolatile memory 90 and the channel of the DDR SDRAM.

Also in the memory system according to the third embodiment, similarly to the modification of the memory system according to the first and second embodiments, per group among the m groups, dedicated pads 20 (one of which is shown in FIG. 15) may be provided for the ZQ calibration terminals TZQ of the memory physical layer circuits 50 (50_1, 50_2, 50_3, . . . , 50_n), respectively, and each of the ZQ calibration terminals TZQ may be wired-OR connected on the package substrate 100 outside the SoC 10 via the dedicated pads 20 and then connected to the reference resistor 30 via the solder ball 15.

(ZQ Calibration Process)

Figure 16:
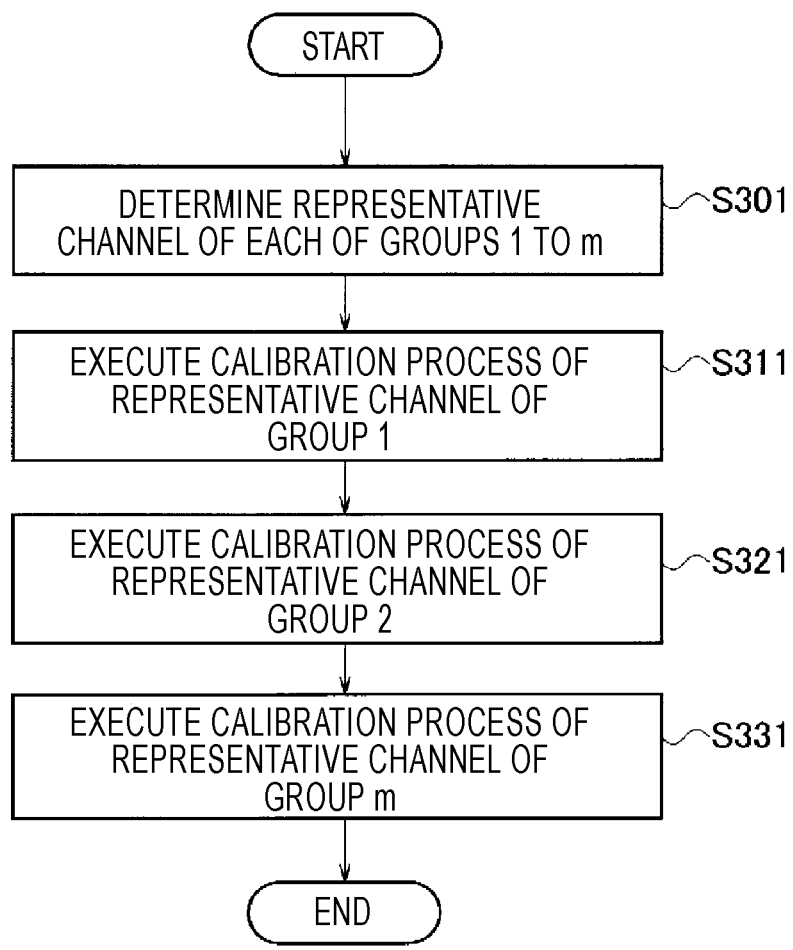
FIG. 16 is a flowchart illustrating the ZQ calibration process in the memory system according to the third embodiment.

FIG. 16 is a flowchart illustrating the ZQ calibration process in the memory system according to the third embodiment. FIG. 16 illustrates the ZQ calibration process of the memory system in which the plurality of groups 1 to m are configured as a group that shares the reference resistor 30.

In step S301, a representative channel is determined from the channels in each of the groups 1 to m that includes adjacent channels having similar VT conditions. Specifically, information on the determined representative channel is selected in the registers 42 (42_1, 42_2, . . . , 42_n). The representative channel may be manually selected from the outside, or may be appropriately selected and determined by the processor 60 in the SoC 10.

In step S311, the processor 60 performs the ZQ calibration process on the memory physical layer circuit 50 of the representative channel of group 1 and shares the ZQ calibration result with each channel in group 1. The ZQ calibration process of the representative channel of group 1 can be performed exclusively without an exclusive control in group 1, and therefore can be performed constantly or at any timing.

Similarly, in step S321, the processor 60 performs the ZQ calibration process on the memory physical layer circuit 50 of the representative channel of group 2 and shares the ZQ calibration result with each channel in group 2. The ZQ calibration process of the representative channel of group 2 can be performed exclusively without an exclusive control in group 2, and therefore can be performed constantly or at any timing.

Further, similarly, in step S331, the processor 60 performs the ZQ calibration process on the memory physical layer circuit 50 of the representative channel of group m, and shares the ZQ calibration result with each channel in group m. The ZQ calibration process for the representative channel of group m can be performed exclusively without an exclusive control in group m, and therefore can be performed constantly or at any timing.

Further, steps S311, S321, and S331 may be performed in parallel.

As described above, in the memory system and the modification thereof according to the third embodiment, even when the number of the reference resistors 30 connected to the outside of the controller 10 in the memory system having the nonvolatile memories connected to the plurality of channels is reduced, the ZQ calibration process of the memory physical layer circuit 50 of each channel can be performed efficiently and effectively.

In particular, in the memory system according to the third embodiment, the ZQ calibration process can be performed at an appropriate frequency without imposing a load on the processor while reducing the manufacturing cost of the memory system.

Fourth Embodiment

Even when a group includes adjacent channels having similar VT conditions at the time of design, when the memory system is actually operated, the VT conditions might not be similar as expected. As a result, a case where an appropriate calibration result is not able to be obtained may be considered.

Thus, the memory system according to the fourth embodiment makes it possible to change the calibration group even after the design.

Figure 17:
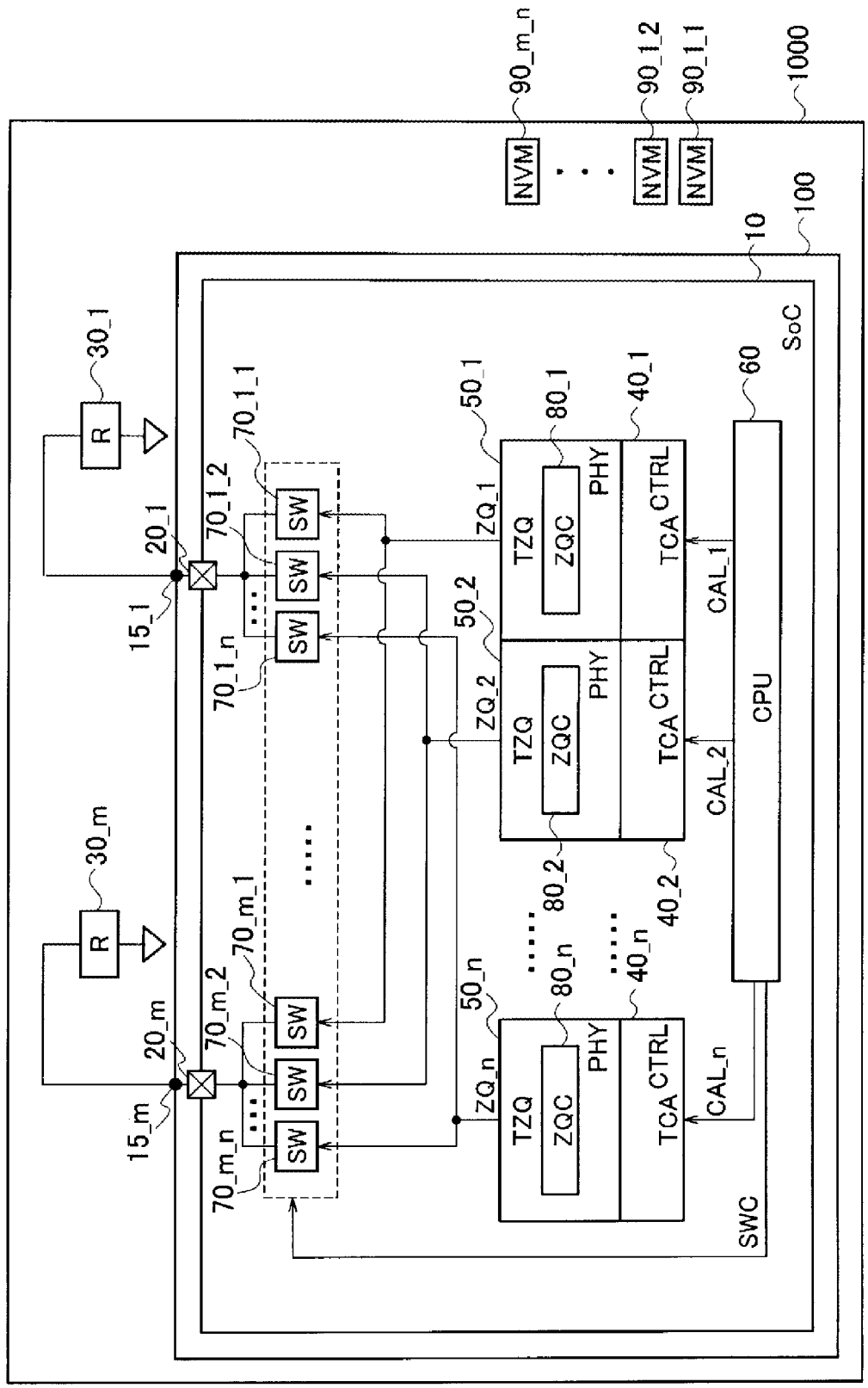
FIG. 17 is a schematic block configuration diagram of a memory system according to a fourth embodiment.

The block configuration of the memory system according to the fourth embodiment is schematically represented as illustrated in FIG. 17.

The memory system according to the fourth embodiment includes a printed circuit board 1000, nonvolatile memories (90_1_1, 90_1_2, ..., 90_m_n) disposed on the printed circuit board 1000, a package substrate 100 disposed on the printed circuit board 1000, and an SoC 10 disposed on the package substrate 100. The nonvolatile memories 90 and the SoC 10 are connected to each other through a plurality of channels.

The SoC 10 includes, per group among m groups, n memory physical layer circuits 50_1, 50_2, ..., 50_n arranged corresponding to the plurality of channels, respectively, n memory controllers 40_1, 40_2, ..., 40_n that control the memory physical layer circuits 50_1, 50_2, ..., 50_n, respectively, m ZQ calibration pads 20_1, ..., 20_m. The SoC 10 also includes m×n switches (SW) (70_1_1, 70_1_2, ..., 70_1_n), ..., (70_m_1, 70_m_2, ..., 70_m_n) that are respectively provided corresponding to the memory physical layer circuits 50_1, 50_2, ..., 50_n for the m ZQ calibration pads 20_1, ..., 20_m, and a processor (CPU) 60 that controls each part of the SoC 10.

The memory system according to the fourth embodiment further includes m reference resistors (R) 30_1, ..., 30_m for ZQ calibration which are connected to the memory physical layer circuits 50_1, 50_2, ..., 50_n, respectively, via pads 20_1, ..., 20_m and the solder balls 15_1, ..., 15_m. on the printed circuit board 1000.

The switches 70 (70_m_1, 70_m_2, ..., 70_m_n) connected to the memory physical layer circuits 50_1, 50_2, ..., 50_n, respectively, are controlled by the processor 60 so that only one of the n switches 70 corresponding to the memory physical layer circuits 50_1, 50_2, ..., 50_n is turned on, whereby the memory physical layer circuit 50 and the memory controller 40 are assigned to any one of the m groups each of which shares one of the m reference resistors 30_1, ..., 30_m. The ZQ calibration terminals TZQ of each group are wired-OR connected inside the SoC 10 and connected to one of the m reference resistors 30 via one of the m pads 20. The processor 60 performs the ZQ calibration process of each memory physical layer circuit 50 in a time division method using any one of the reference resistors 30 connected for each group.

Here, as for the switch 70, for example, a switch capable of switching ON (short circuit) /OFF (release) of an analog signal such as a mechanical switch, a mechanical relay switch, and a semiconductor switch may be used.

In the memory system according to the fourth embodiment, the ZQ calibration process is performed on each of the n memory physical layer circuits 50, for example, in the initialization sequence after power-on. Based on each ZQ calibration result of the memory physical layer circuit 50, the processor 60 controls each switch 70 using a control signal SWC and assigns the n memory physical layer circuits 50 and the memory controller 40 to any one of the m groups each of which shares one of the m reference resistors 30. For example, since channels having similar calibration results may be determined to have similar VT conditions, such channels may be grouped to one group.

Further, information related to the control of each switch 70 may be stored in a control register (not illustrated) or the like in the SoC 10, and the processor 60 may also execute a control of each switch 70 while referring to the control register.

Thus, logical grouping is performed, and thereafter, the ZQ calibration process as described in the second and third embodiments is performed in each group.

Thus, in the memory system according to the fourth embodiment, since it is possible to change a group for ZQ calibration process even after the device design, such as when the VT conditions of adjacent memory physical layer circuits 50 are not similar, the ZQ calibration process maybe performed under optimum conditions.

(Modification)

Figure 18:
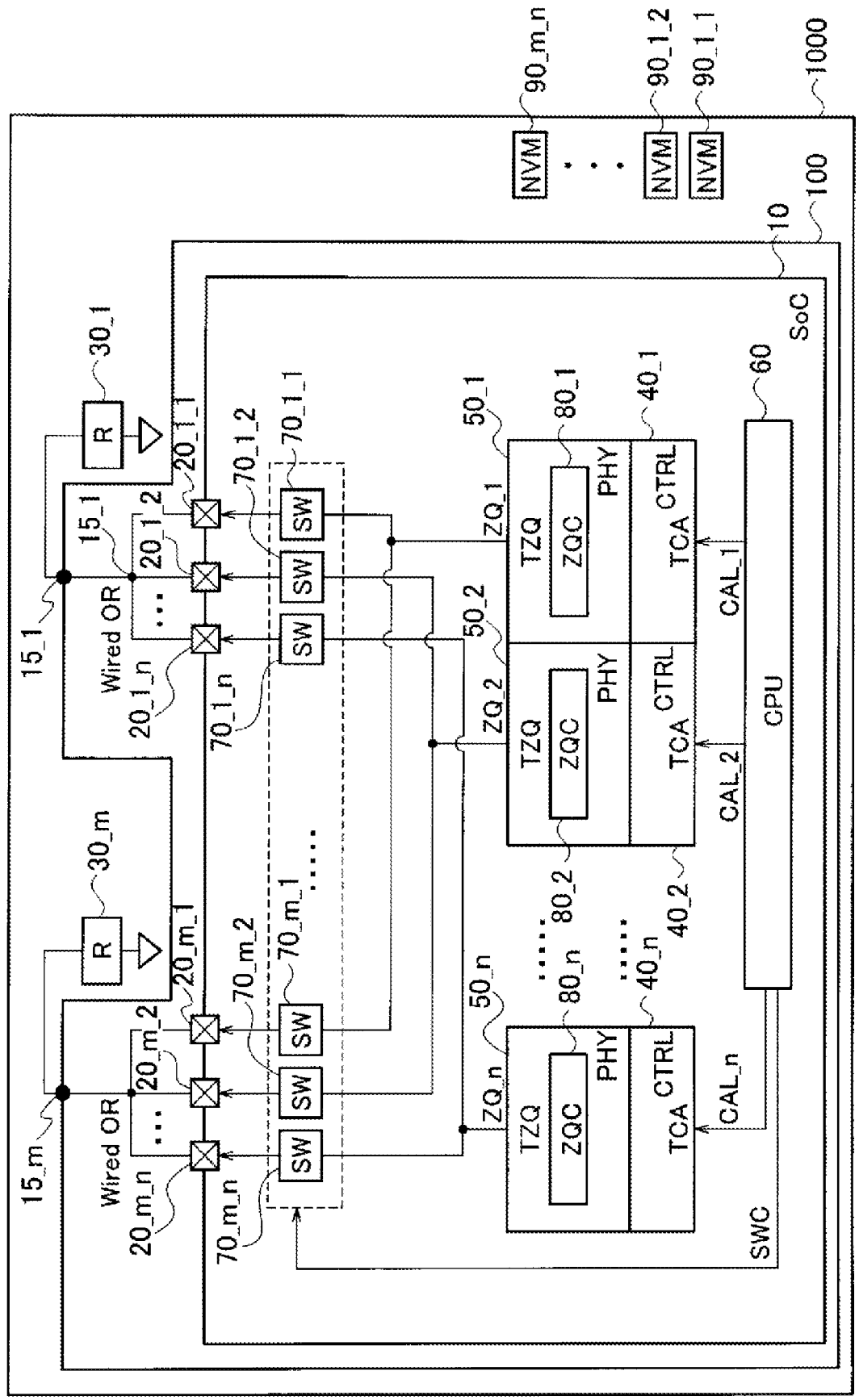
FIG. 18 is a schematic block diagram of a memory system according to a modification of the fourth embodiment.

A block configuration of a modification of the memory system according to the fourth embodiment is schematically represented as illustrated in FIG. 18.

In the memory system according to the fourth embodiment illustrated in FIG. 17, the ZQ calibration terminal TZQ in each group is wired-OR connected inside the SoC 10 via the switch 70 and connected to the reference resistor 30 via the pad 20. In contrast, in the modification illustrated in FIG. 18, dedicated pads (20_1_1, 20_1_2, ..., 20_1_n), ..., (20_m_1, 20_m_2, ..., 20_m_n) are provided for the ZQ calibration terminals TQZ, respectively, and each of the ZQ calibration terminals TZQ is, per group among the m groups, wired-OR connected on the package substrate 100 outside the SoC 10 via the switch 70 and a dedicated pad 20 and connected to any one of the reference resistors 30_1, ..., 30_m via any one of the solder balls 15_1, ..., 15_m.

More specifically, the dedicated pads 20_1_1, 20_1_2, ..., 20_1_n are provided for each ZQ calibration terminal TZQ of the memory physical layer circuit 50 assigned to the first group, and each ZQ calibration terminal TZQ is wired-OR connected on the package substrate 100 outside the SoC 10 via the dedicated pads 20_1_1, 20_1_2, ..., 20_1_n and connected to the first group reference resistor 30_1 via the solder ball 15_1. Similarly, the dedicated pads 20_m_1, 20_m_2, ..., 20_m_n are provided for each ZQ calibration terminal TZQ of the memory physical layer circuit 50 assigned to the m-th group, and each ZQ calibration terminal TZQ is wired-OR connected on the package substrate 100 outside the SoC 10 via the dedicated pads 20_m_1, 20_m_2, ..., 20_m_n and connected to the m-th group reference resistor 30_m via the solder ball 15_m.

The configuration other than the above is the same as that of the memory system according to the fourth embodiment.

(ZQ Calibration Process)

The ZQ calibration process of the memory system according to the fourth embodiment is represented by the flowchart schematically illustrated in FIG. 19. The flowchart illustrated in FIG. 19 represents an example of a process of changing a group configuration of the m groups as illustrated in FIG. 17.

In step S410, the processor 60 performs the ZQ calibration process on the first memory physical layer circuit 50_1_1, the first memory physical layer circuit 50_2_1, ..., and the first memory physical layer circuit 50_m_1 in each of the first to m-th groups. Similarly, in step S420, the processor 60 performs the ZQ calibration process from the second memory physical layer circuit 50_1_2, the second memory physical layer circuit 50_2_2, ..., the second memory physical layer circuit 50_m_2 in each of the first to m-th groups, to the (n-1)th memory physical layer circuit 50_1_(n-1), the (n-1)th memory physical layer circuit 50_2 (n-1), . . . , the (n-1)th memory physical layer circuit 50_m (n-1) in each of the first to m-th groups. Further, in step S430, the processor 60 performs the ZQ calibration process on the n-th memory physical layer circuit 50_1_n, the n-th memory physical layer circuit 50_2_n, . . . , the n-th memory physical layer circuit 50_m_n in each of the first to m-th groups. The processes in steps S410 to S430 are the same as those in steps S210 to S230 in the flowchart of FIG. 9 described in the second embodiment.

In step S440, the processor 60 controls each switch (70_1_1, 70_1_2, . . . , 70_1_n), . . . , (70_m_1, 70_m_2, . . . , 70_m_n) based on the result of the ZQ calibration process in steps S410 to S430 to change the group for the ZQ calibration process.

In steps S450 to S470, the processor 60 performs the ZQ calibration process for each of the first to m-th groups. Further, steps S450, S460, and S470 may be performed in parallel.

As described above, according to the memory system according to the first to fourth embodiments and modifications thereof, in the memory system having nonvolatile memories connected to a plurality of channels, (1) a plurality of memory physical layer circuits respectively corresponding to the plurality of channels are commonly connected to a reference resistor via a single calibration pad, and the reference resistor is used in a time division manner, (2) a plurality of sets of the calibration pad and the reference resistor are provided to group channels under similar conditions and optimize the frequency of the ZQ calibration process, (3) the plurality of channels commonly connected to the reference resistor are arranged adjacent to each other, and the ZQ calibration result of a part of the plurality of channels is also applied to other channels, and (4) the group is configured to be reorganized as necessary. Therefore, in a memory system having nonvolatile memories connected to a plurality of channels, even when the number of reference resistors connected to the outside of the controller is reduced, it is possible to provide a memory system capable of efficiently and effectively performing the ZQ calibration of the memory physical layer circuit of each channel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a plurality of nonvolatile memories;
    a controller connected to the plurality of nonvolatile memories via a plurality of channels, the controller including:
        a plurality of memory physical layer circuits arranged corresponding to the plurality of channels, respectively,
        one or more pads for calibration corresponding to the plurality of memory physical layer circuits, and
        a processor configured to control the plurality of memory physical layer circuits; and
    a single reference resistor for calibration connected to the plurality of memory physical layer circuits via the one or more pads,
    wherein an output based on the calibration of each of the plurality of memory physical layer circuits is wired-OR connected and connected to the single reference resistor via the one or more pads, and
    the processor performs the calibration for each of the plurality of memory physical layer circuits in a time division manner using the single reference resistor.

2. The memory system according to claim 1, wherein the one or more pads is a single pad, and a calibration terminal of each of the plurality of memory physical layer circuits is wired-OR connected inside the controller and connected to the single reference resistor via the single pad.

3. The memory system according to claim 1, wherein a calibration terminal of each of the plurality of memory physical layer circuits includes a dedicated pad, and an output based on the calibration is wired-OR connected to a solder ball outside the controller via the dedicated pad and connected to the single reference resistor.

4. A memory system comprising:
    a plurality of nonvolatile memories;
    a controller connected to the plurality of nonvolatile memories via a plurality of channels, the controller including:
        a plurality of memory physical layer circuits arranged corresponding to the plurality of channels, respectively,
        a plurality of pads for calibration corresponding to the plurality of memory physical layer circuits, respectively, and
        a processor configured to control the plurality of memory physical layer circuits; and
    a plurality of reference resistors for calibration connected to the plurality of memory physical layer circuits, respectively, via the plurality of pads,
    wherein the plurality of memory physical layer circuits are logically divided into a plurality of groups, and the plurality of memory physical layer circuits belonging to one of the plurality of groups share one of the plurality of reference resistors, and an output based on the calibration of each of the memory physical layer circuits belonging to each of the groups is wired-OR connected and connected to one of the plurality of reference resistors via one of the plurality of pads, and
    the processor performs a calibration process of the memory physical layer circuits using any one of the plurality of reference resistors connected to each of the groups.

5. The memory system according to claim 4, wherein the processor performs the calibration process of the memory physical layer circuits in a time division manner for each of the groups.

6. The memory system according to claim 4, wherein the processor performs the calibration process using any one of the plurality of reference resistors only for the memory physical layer circuit selected as a representative channel among the plurality of memory physical layer circuits belonging to a first group of the plurality of groups, and
    the plurality of memory physical layer circuits belonging to the first group include a selector connected so that calibration results of all the memory physical layer circuits belonging to the first group are input thereto, and a calibration result of the memory physical layer circuit selected as the representative channel from the calibration results is selected by the selector.

7. The memory system according to claim 6, further comprising: a register that stores information indicating the memory physical layer circuit selected as the representative channel among the memory physical layer circuits in the first group.

8. The memory system according to claim 7, further comprising:
a plurality of switches provided for each of the plurality of pads, the number of the plurality of switches being same as the number of the plurality of memory physical layer circuits;
wherein the switches connected to the memory physical layer circuits are controlled by the processor so that only one of the plurality of memory physical layer circuits corresponding to one of the plurality of pads is turned on, and the memory physical layer circuit is assigned to any one of a plurality of groups each of which shares one of the plurality of reference resistors, and
the processor performs a calibration process of each of the memory physical layer circuits in a time division manner for each group using any one of the reference resistors.

9. The memory system according to claim 4, wherein the output based on the calibration of each of the memory physical layer circuits is wired-OR connected inside the controller and connected to any one of the plurality of reference resistors via the pad.

10. The memory system according to claim 4, wherein a dedicated pad is provided for each of the outputs based on calibrations of the plurality of memory physical layer circuits, and each output based on the calibrations is wired-OR connected to a solder ball outside the controller via the dedicated pad and connected to any one of the plurality of reference resistors.

11. A memory system comprising:
a plurality of nonvolatile memories;
a controller connected to the plurality of nonvolatile memories via a plurality of channels, the controller including:
a plurality of memory physical layer circuits arranged corresponding to the plurality of channels, respectively,
one or more pads for calibration corresponding to the plurality of memory physical layer circuits, respectively,
wherein the plurality of memory physical layer circuits are logically divided into a plurality of groups, each group having a representative channel;
a processor configured to control the plurality of memory physical layer circuits;
a reference resistor for calibration connected to the plurality of memory physical layer circuits, respectively, via the one or more pads; and
a register that stores information indicating which memory physical layer circuit in each group is selected as the representative channel,
wherein the controller further includes a selector that selects a calibration result of the representative channel based on the information in the register and the processor performs a calibration process of the memory physical layer circuits for only the representative channel and shares the calibration result for the representative channel with each channel in each group, and
an output based on a calibration of each of the memory physical layer circuits belonging to each of the groups is wired-OR connected and connected to the reference resistor via the one or more pads.

12. The memory system according to claim 11, wherein the register is a single register.

13. The memory system according to claim 11, wherein the register is provided in the controller.

14. The memory system according to claim 11, wherein the one or more pads is a single pad, and a calibration terminal of each of the plurality of memory physical layer circuits is wired-OR connected inside the controller and connected to the single reference resistor via the single pad.

15. The memory system according to claim 11, wherein a calibration terminal of each of the plurality of memory physical layer circuits includes a dedicated pad, and an output based on the calibration is wired-OR connected to a solder ball outside the controller via the dedicated pad and connected to the single reference resistor.

16. The memory system according to claim 11, wherein the processor performs the calibration process of the memory physical layer circuits for the representative channels of each group in parallel.

* * * * *